US008431969B2

(12) United States Patent  
Kim et al.

(10) Patent No.: US 8,431,969 B2
(45) Date of Patent: Apr. 30, 2013

(54) INTERCONNECTION STRUCTURE OF THREE-DIMENSIONAL SEMICONDUCTOR DEVICE

(75) Inventors: Doogon Kim, Hwaseong-si (KR); Donghyuk Chae, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 65 days.

(21) Appl. No.: 12/983,903

(22) Filed: Jan. 4, 2011

(65) Prior Publication Data

US 2011/0204420 A1 Aug. 25, 2011

Related U.S. Application Data

(60) Provisional application No. 61/354,744, filed on Jun. 15, 2010.

(30) Foreign Application Priority Data

Feb. 19, 2010 (KR) ........................ 10-2010-0015306

(51) Int. Cl.
*H01L 23/52* (2006.01)
(52) U.S. Cl.
USPC ............... 257/211; 257/314; 257/E27.046; 365/185.06; 365/72; 365/184

(58) Field of Classification Search .................. 257/206, 257/211, 314–326, E27.046, E27.06, E29.262, 257/E29.3, E29.309; 365/185.01, 185.06, 365/72, 184; 438/201, 211, 257
See application file for complete search history.

(56) References Cited

U.S. PATENT DOCUMENTS

2008/0173932 A1 7/2008 Kidoh et al.
2009/0267139 A1* 10/2009 Maejima ....................... 257/326

FOREIGN PATENT DOCUMENTS

| JP | 2008-171918 | 7/2008 |
| JP | 2008-258458 | 10/2008 |
| JP | 2009-266280 | 11/2009 |

* cited by examiner

*Primary Examiner* — Tucker Wright
(74) *Attorney, Agent, or Firm* — Volentine & Whitt, PLLC

(57) ABSTRACT

A three-dimensional semiconductor device includes stacked structures arranged two-dimensionally on a substrate, a first interconnection layer including first interconnections and disposed on the stacked structures, and a second interconnection layer including second interconnections and disposed on the first interconnection layer. Each of the stacked structures has a lower region including a plurality of stacked lower word lines, and an upper region including a plurality of stacked upper word lines disposed on the stack of lower word lines. Each of the first interconnections is connected to one of the lower word lines and each of the second interconnections is connected to one of the upper word lines.

18 Claims, 23 Drawing Sheets

US 8,431,969 B2

INTERCONNECTION STRUCTURE OF THREE-DIMENSIONAL SEMICONDUCTOR DEVICE

PRIORITY STATEMENT

This U.S. non-provisional patent application claims priority under 35 U.S.C. §119 of Korean Patent Application No. 10-2010-0015306, filed on Feb. 19, 2010 and Provisional application No. 61/354,744, filed on Jun. 15, 2010.

BACKGROUND

The inventive concept relates to a semiconductor device. More particularly, the inventive concept relates to a three-dimensional semiconductor device having stacked layers of word lines.

Semiconductor memory devices are becoming more highly integrated to meet consumer demand for high performance and affordable electronic devices. That is, the degree of integration of a semiconductor device is an important factor for determining its price. Therefore, the degree of integration of semiconductor memory devices must be increased to keep costs down. The degree of integration of a typical two-dimensional or planar semiconductor memory device is mainly determined by the area that a unit memory cell of such a device occupies. The ability to scale down the area of a unit memory cell depends on the level of sophistication of techniques for forming fine patterns of features that make up the memory cells. In this respect, high-priced diverse pieces of equipment are required for forming fine patterns. Therefore, there are limitations in the cost savings that can be obtained when increasing the degree of integration of a two-dimensional semiconductor memory device.

SUMMARY

According to one aspect of the inventive concept, there is provided a three-dimensional semiconductor device comprising a substrate, stacked structures each including a plurality of stacked word lines on the substrate, a first interconnection layer including first interconnections and disposed on the stacked structures, and a second interconnection layer including second interconnections and disposed on the first interconnection layer. The stacked structures are disposed adjacent one another in a horizontal direction on the substrate so as to occupy a two-dimensional space on the substrate. Each of the first interconnections is electrically connected to one of the word lines in a lower region of a stacked structure, and each of the second interconnections is electrically connected to one of the word lines in an upper region of the stacked structure located on the lower region.

According to another aspect of the inventive concept, there is provided a three-dimensional semiconductor device including a substrate, at least one layer of a plurality of interconnections on the substrate, and a number of stacked layers of word line layers interposed between the substrate and the interconnections, and which satisfy: $W1 < L*P2$. Here, each of the layers of word lines includes a plurality of groups of word lines, each of the groups of word line includes a plurality of word lines in an equipotential state, each of the interconnections is connected to a respective one of the groups of word lines, L is the number of stacked layers of word lines, W1 is the pitch of the word line groups in each layer, and P2 is the minimum pitch of the interconnections in a layer.

DETAILED DESCRIPTION OF THE PREFERRED EMBODIMENTS

Figure 1:
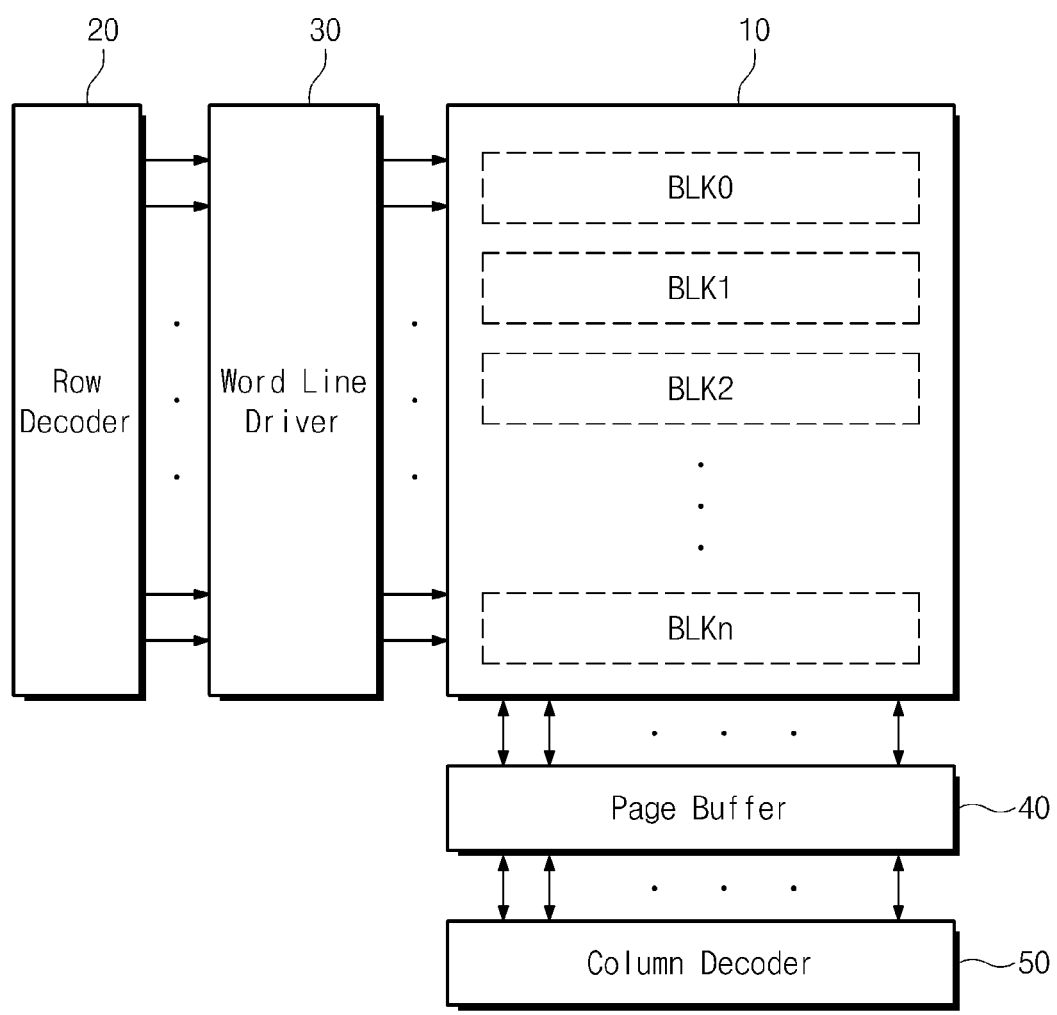
FIG. 1 is a block diagram of a semiconductor memory device including a three-dimensional memory cell array according to the inventive concept.

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the semiconductor devices are generally schematic. Also, like numerals designate like elements throughout the drawings.

Furthermore, terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present. The term "pattern" is generally meant to refer to an element or feature formed by the patterning of a layer using processes known per se in the art.

Furthermore, when features are described as "arranged two-dimensionally", as will be readily appreciated from the drawings, such a description refers to an arrangement in which the features come to occupy a two-dimensional space. Thus, whereas such a description includes an arrangement of linear features side-by-side, for example, such a description would preclude an arrangement of the same linear features end-to-end.

Hereinafter, embodiments of the inventive concept will be described in more detail as exemplified by a NAND-flash memory.

Referring to FIG. 1, a semiconductor memory device includes a memory cell array 10, a row decoder 20, a word line driver 30, a page buffer 40, and a column decoder 50.

The memory cell array 10 includes a plurality of memory blocks BLK0 to BLKn and the memory blocks BLK0 to BLKn include a plurality of word lines, bit lines, and memory cells, and store data. The memory blocks BLK0 to BLKn will be described in more detail with reference to FIGS. 3 through 5.

The row decoder 20 selects the memory blocks BLK0 to BLKn of the memory cell array 10 and selects word lines in the selected memory block based on address data.

Word line driver 30 applies a program voltage or a pass voltage to the word lines. For example, word line driver 30 applies the program voltage to the selected word line and applies a ground or the pass voltage to non-selected word lines in a program operation.

The page buffer 40 temporarily stores data to be stored in memory cells or senses the data stored in the memory cells according to an operation mode. The page buffer 30 operates as a write driver during a program operation, and operates as a sense amplifier during a read operation. Although not illustrated in the drawings, the page buffer 30 may include page buffers which are connected to respective bit lines or respective bit line pairs.

The column decoder 50 provides a data transmission path between the page buffer 30 and an external device (e.g., a memory controller).

Figure 2:
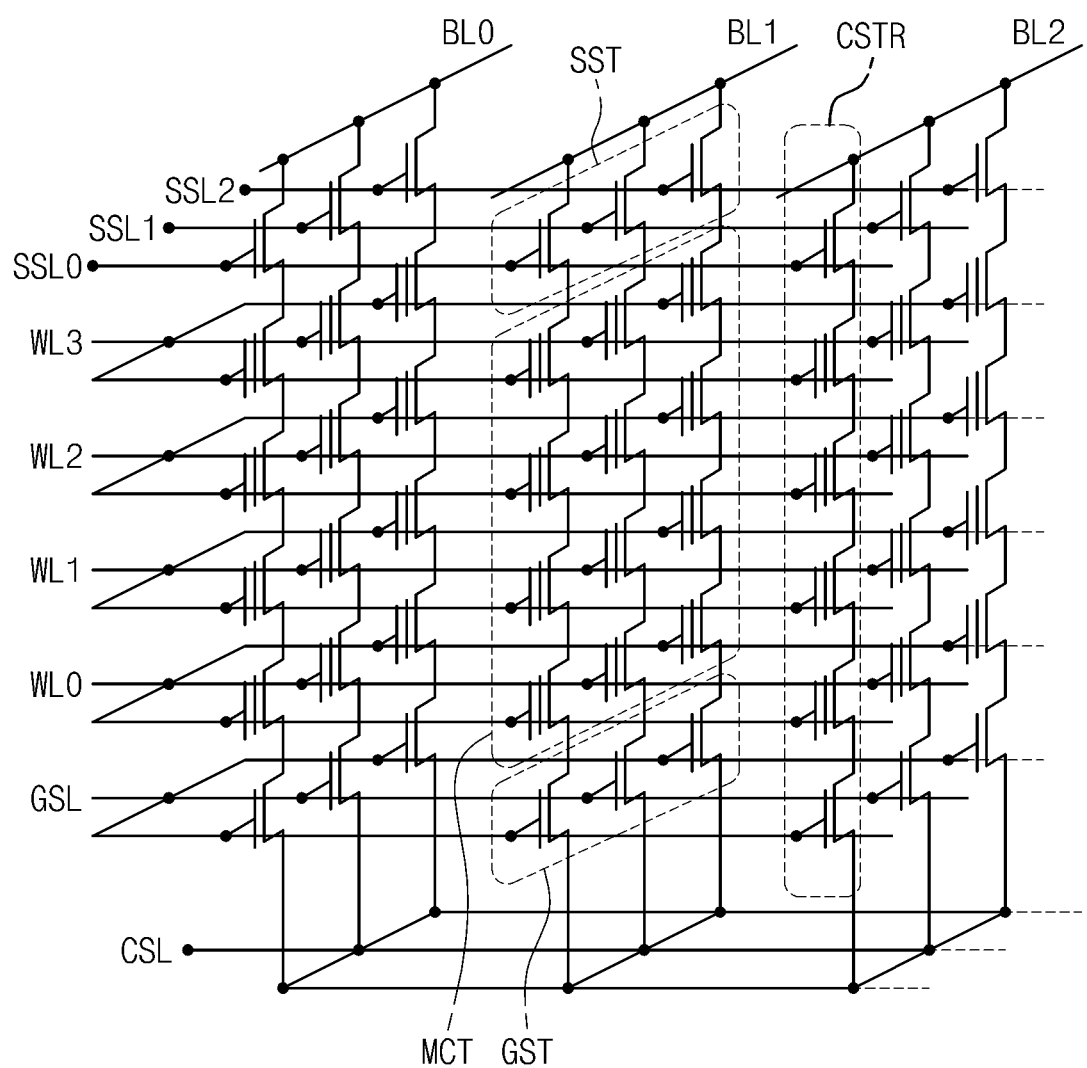
FIG. 2 is a circuit diagram of a three-dimensional memory cell array of a semiconductor memory device.
Figure 3:
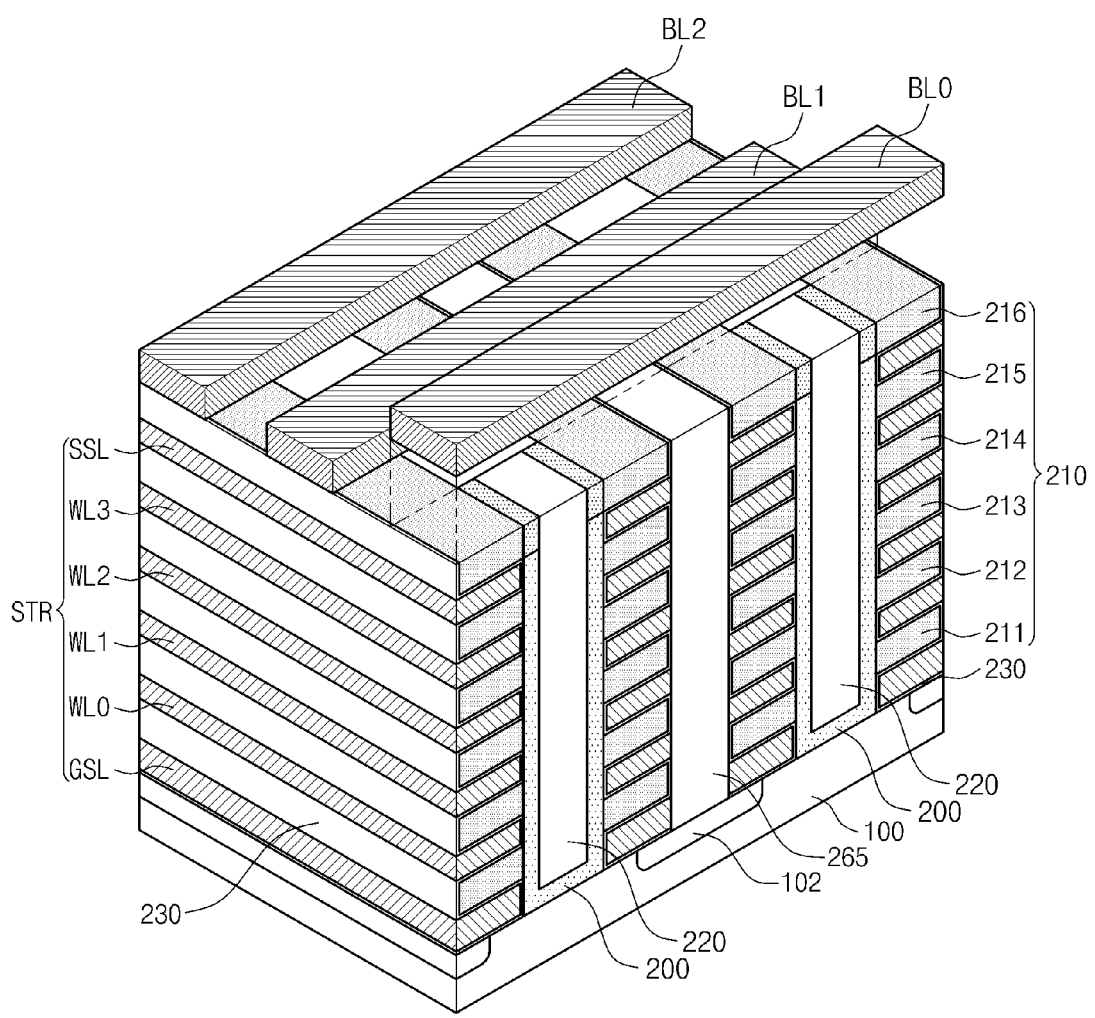
FIGS. 3 through 5 are each a perspective view of a respective example of a three-dimensional memory cell array according the inventive concept, which may constitute a memory block of the semiconductor memory device of FIG. 1.
Figure 4:
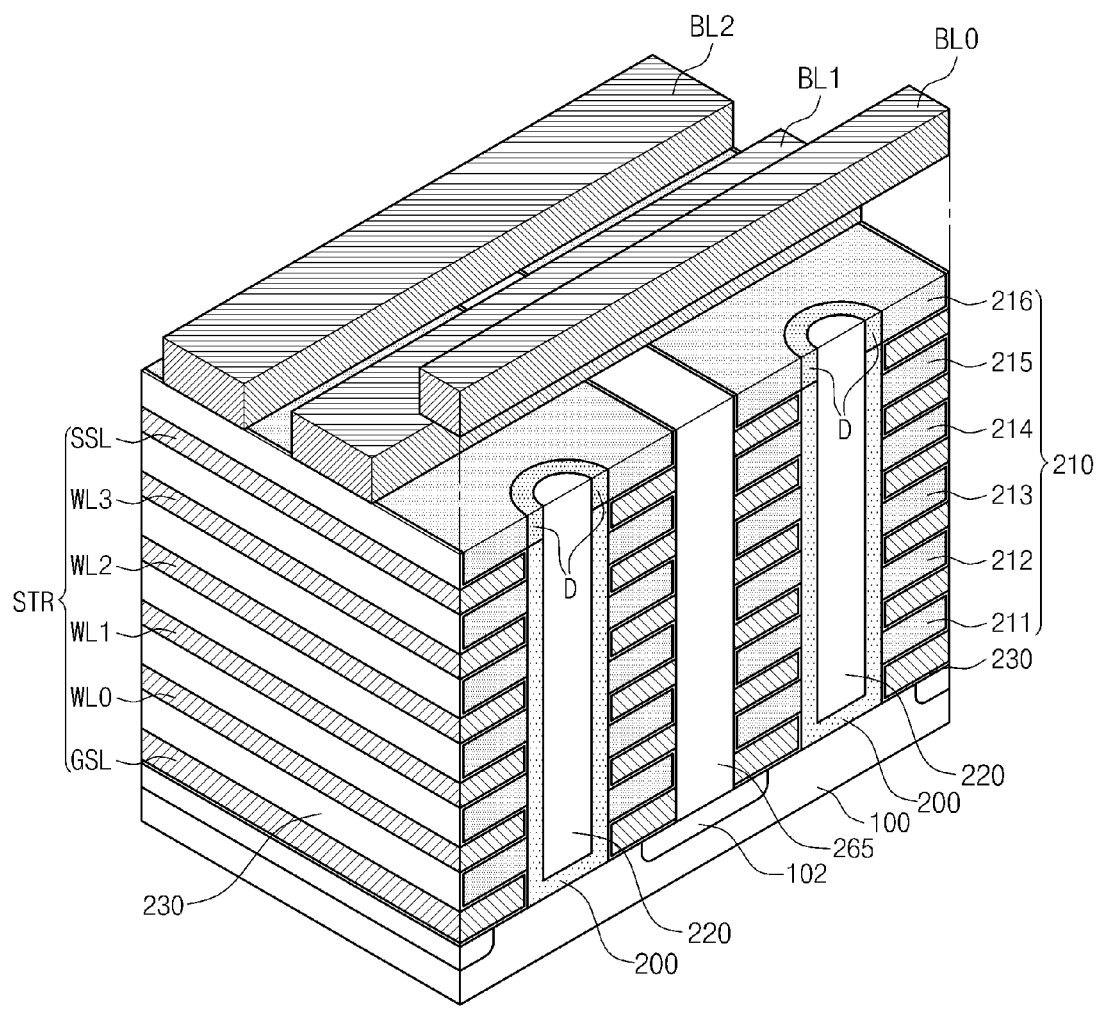
Figure 5:
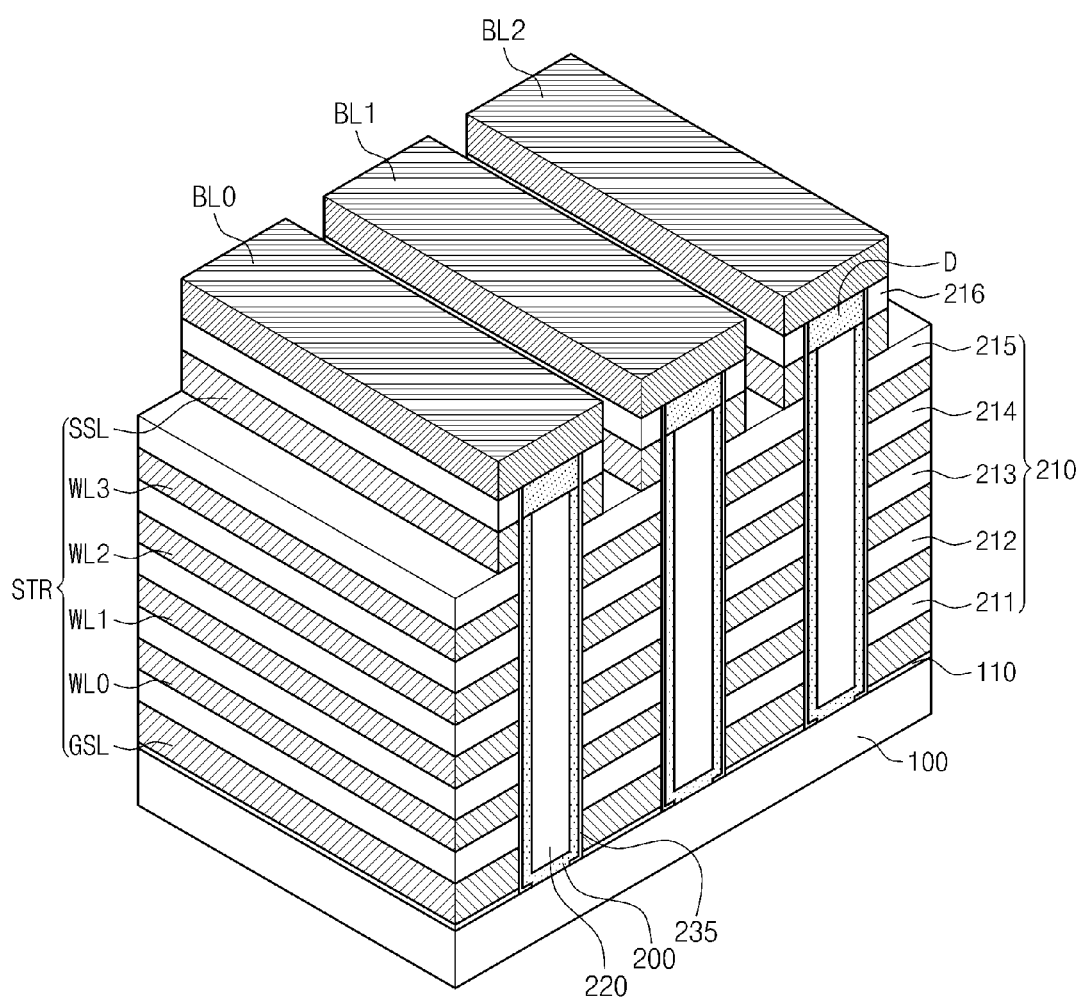

FIG. 2 is a circuit diagram of components to which reference will be made for a basic understanding of the layout of a three-dimensional memory cell array. FIGS. 3-5 show examples of memory cell arrays according to the inventive concept.

A memory cell array according to the inventive concept includes a common source line CSL, a plurality of bit lines BL0 to BL2, a plurality of layers of word lines WL0 to WL3, a layer of string source lines SSL, and a plurality of cell strings CSTR disposed between the common source line CSL and the bit lines BL0 to BL2.

The common source line CSL may be a conductive thin layer 110 disposed on a substrate 100 (FIG. 5) or an impurity region 102 formed in the substrate 100 (FIGS. 3 and 4). The bit lines BL0 to BL2 are conductive patterns (e.g., metal lines) spaced from the substrate 100 and disposed thereon. The bit lines BL0 to BL2 are arranged two-dimensionally and a plurality of respective cell strings CSTR are connected in parallel to each of the bit lines BL0 to BL2. Accordingly, the cell strings CSTR connected to each bit line BL are two-dimensionally arranged on the common source line CSL or the substrate 100.

Each of the cell strings CSTR includes a ground selection transistor GST connected to the common source line CSL, a string selection transistor connected to the bit line, and a plurality of memory cell transistors disposed between the ground and string selection transistors GST and SST. The ground selection transistor GST, the string selection transistor SST, and the memory cell transistors are connected in series. Furthermore, the ground selection line GSL, the word lines WL0 to WL3, and the string selection lines SSL, disposed between the common source line CSL and the bit lines BL0 to BL2 may serve as gate electrodes of the ground selection transistors GST, the memory cell transistors, and the string selection transistors SST, respectively. To this end, the ground selection line GSL, the word lines WL0 to WL3, and the string selection lines SSL are stacked on the substrate 100, with interlayer insulation layers 211 to 216 respectively interposed between the ground selection line GSL and the vertically adjacent word line WL0, between vertically adjacent ones of the world lines WL0 to WL3, and between the group of string selection lines SSL and the group of bit lines BL0 to BL2. The interlayer insulation layers 211 to 216 together constitute interlayer insulation 210 of the array.

All of the ground selection transistors GST are disposed at substantially the same distance from the substrate 100 and their gate electrodes are commonly connected to the ground selection line GSL and thus are in an equipotential state. For this purpose, the ground selection line GSL may be a plate- or comb-shaped conductive pattern, which is disposed between the common source line CSL and the memory cell transistors MCT that are closest to the common source line CSL. Similarly, gate electrodes of those memory cell transistors MCT which are disposed at substantially the same distance from the common source line CSL are commonly connected to word lines WL0 to WL3 in a layer and thus are in an equipotential state. That is, the same voltage can be applied to the gate electrodes of those memory cell transistors MCT disposed at the same height from the substrate 100, i.e., the memory cell transistors MCT of one memory block. For this purpose, the word lines WL0 to WL3 may be constituted by a plate- or comb-shaped conductive pattern parallel to the upper surface of the substrate 100. In addition, because one cell string CSTR includes a plurality of memory cell transistors MCT at respectively different distances from the common source line CSL, the stacked layers of word lines WL0 to WL3 are disposed between the common source line CSL and the group of bit lines BL0 to BL2. The layers of word lines WL0 to WL3 are electrically isolated from one another.

Each of the cell strings CSTR includes a semiconductor pattern 200 that extends vertically from the common source line CSL and is conductively connected a bit line BL. The semiconductor patterns 200 penetrate the ground selection line GSL and the layers of word lines WL0 to WL3. Furthermore, each semiconductor pattern 200 may include impurity regions formed at one end or both ends thereof. For example, as shown in FIG. 4, a drain region D may be formed at the top end of each semiconductor pattern 200 (a portion connected to a respective one of the bit lines BL0 to BL2).

According to one example shown in FIG. 3, the semiconductor pattern 200 is U-shaped. The semiconductor pattern 200 crosses over inner sidewalls of the ground selection line GSL, layers of word lines WL0 to WL3, and a string selection line SSL. An insulation layer 265 may be interposed between adjacent ones of the semiconductor patterns 200. According to another example shown in FIGS. 4 and 5, each semiconductor pattern 200 has a hollow cylindrical form penetrating the ground selection line GSL, layers of word lines WL0 to WL3, and a string selection line SSL. An insulation layer 220 fills the semiconductor patterns 200.

Additionally, a data storage layer 230 may be disposed between the word lines WL0 to WL3 and the semiconductor patterns 200. In the example shown in FIGS. 3 and 4, the data storage layer 230 extends over the top surface and the bottom surface of each of the word lines WL0 to WL3 and the inner sidewalls of the conductive lines GSL, WL0 to WL3, and SSL as interposed between these inner sidewalls and the semiconductor patterns 200. Alternatively, as shown in the example of FIG. 5, the data storage layer 235 extends over the inner sidewalls of the stacked interlayer insulation layers 211 to 216 and the conductive lines GSL, WL0 to WL3, and SSL as interposed between these inner sidewalls and the semiconductor patterns 200. Moreover, in an example of this embodiment of the inventive concept, the data storage layer is a charge storage layer. For example, the data storage layer may comprise a trap insulation layer, a float gate electrode, or a layer including conductive nano dots. However, the data storage layer 230 may be of materials and have a structure other than those described above because the inventive concept is not limited to a flash memory device.

A dielectric layer may be provided between the ground selection line GSL and the semiconductor patterns 200 as a gate insulation layer of the ground selection transistors GST. Also, a dielectric layer may be provided between the string selection lines SSL and the semiconductor patterns 200 as a gate insulation layer of the string selection transistors SST. At least one of the gate insulation layers of the ground transistors GST and of the string selection transistors SST may be formed of the same material as the data storage layer of the memory cell transistors MCT, but may be of insulating material (e.g., silicon oxide) used for this purpose in a typical MOSFET.

In the illustrated examples, the ground and string selection transistors GST and SST and the memory transistors MCT constitute MOSFETs in which the semiconductor patterns 200 serve as the channel regions. However, the inventive concept can be applied to a three-dimensional array of MOS capacitors as well. In this case, the semiconductor patterns 200 along with the ground selection line GSL, the word lines WL0 to WL3, and the string selection lines SSL constitute MOS capacitors. Also, the ground selection transistor GST, the memory cell transistors MCT, and the string selection transistor SST of a string CSTR would share an inversion layer, which is formed by a fringe field from the ground selection line GSL, the word lines WL0 to WL3, and a string selection line SSL, such that they are electrically connected.

Moreover, the ground or string selection line GSL or SSL may be thicker than the word lines WL0 to WL3. Additionally, the ground or string selection line GSL or SSL may comprise at least two stacked conductive layers.

The word lines of the three-dimensional semiconductor device array described with reference to FIGS. 3 through 5 are connected to the row decoder 20 (FIG. 1) through a plurality of interconnections (examples of which are shown in and described later with reference to FIGS. 8-21). Moreover, the cell array described with reference to FIGS. 3 through 5 has an interlayer separation and word line pitch such that different voltages can be applied to the layers of word lines WL0 to WL3. Interlayer separation thus refers to the separation and electrical isolation of the layers of word lines WL0 to WL3 from one another.

A three-dimensional semiconductor device including a cell array as described above has a partially sharing type of single layer architecture in which each layer of word lines WL includes a plurality of word line groups WG, and each word line group WG includes horizontally adjacent word lines that are conductively connected to each other in the layer and electrically isolated from the word lines in all of the other word line groups in the layer. The aforementioned interconnections, which connect the cell array to external circuitry, are divided into no less than two layers so as to be disposed at different heights.

A three-dimensional semiconductor device according to the inventive concept satisfies the following equation:

$$P2*L>W1$$

Figure 7:
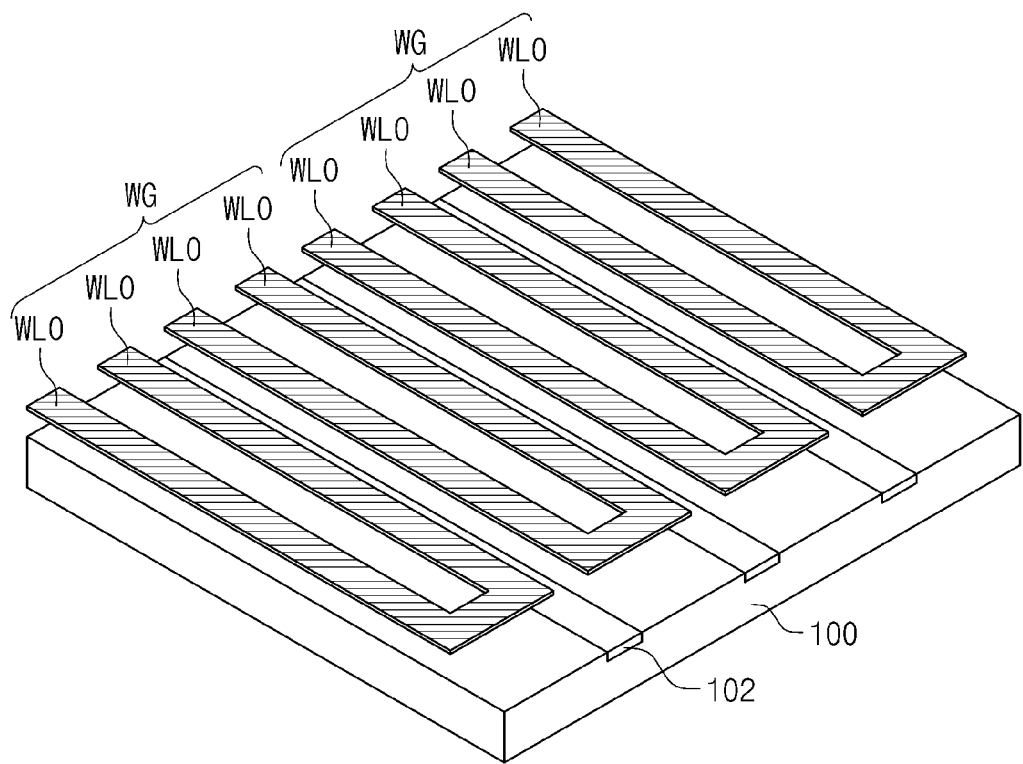
FIG. 7 is a perspective view of a word line group of the first embodiment of a three-dimensional semiconductor device according to the inventive concept.
Figure 10:
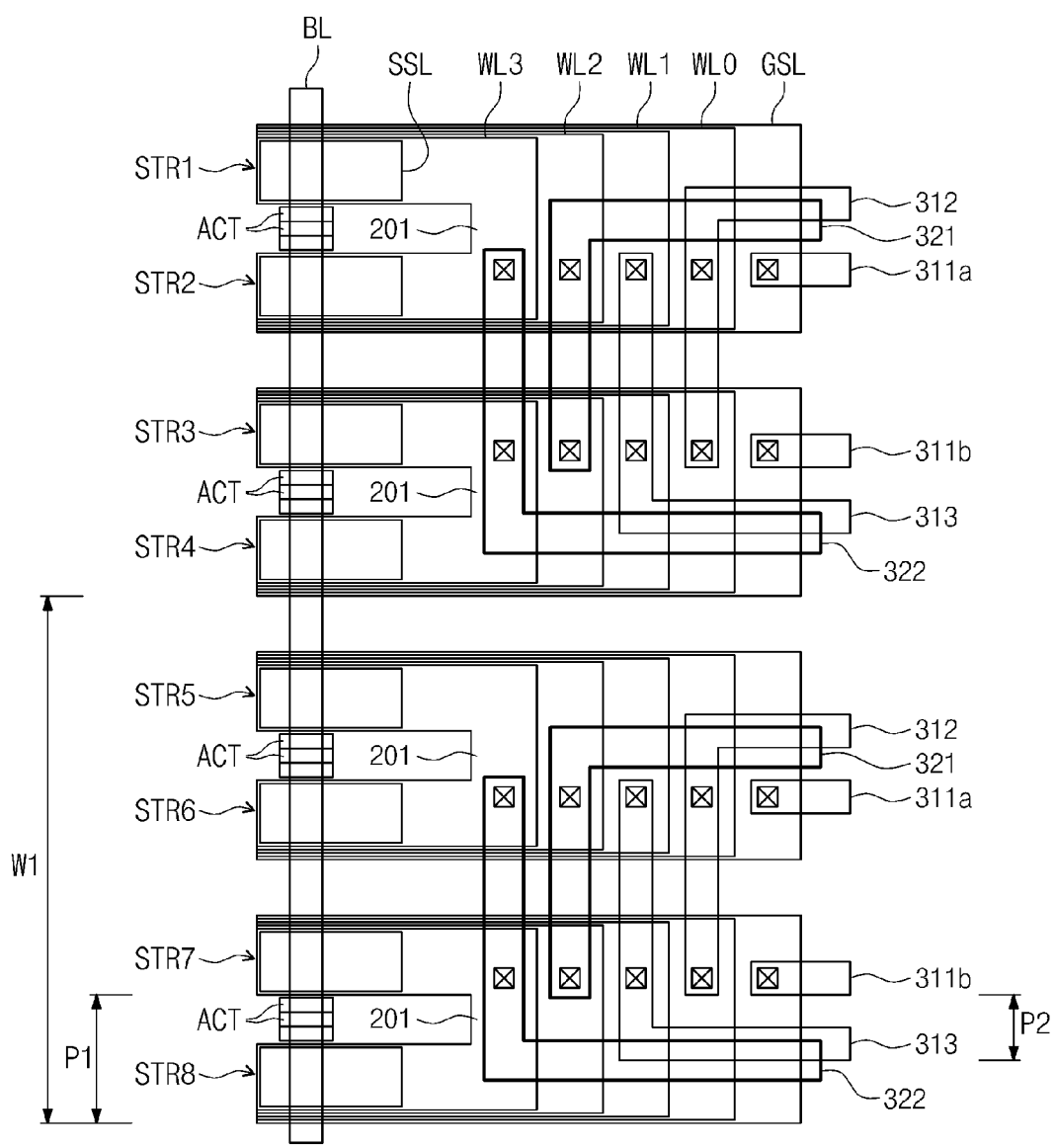
FIG. 10 is a layout diagram of the interconnection structure of the first embodiment of the three-dimensional semiconductor device.

Here (refer to FIG. 10, for example), W1 is the horizontal pitch of the word line groups WG, L is the number of layers of word lines (stacked) on a substrate 100, and P2 is the minimum pitch of interconnections disposed at the same level. As shown in FIGS. 7 and 10, and as was referred to above, a word line group WG is a group of horizontally adjacent word lines disposed at the same height from the substrate 100 and connected in common.

The horizontal pitch P1 of the word lines is one of important design parameters that affect the degree of integration in the three-dimensional semiconductor device. The horizontal pitch P1 of the word lines is the sum of the minimum width of the word lines and the minimum interval between two of any of the horizontally adjacent word lines. And, the minimum width of the word lines is the width of the narrowest of the word lines, and the minimum interval is the minimum of all of the respective intervals between two adjacent word lines. The minimum width and minimum interval are established based on the level of sophistication of the manufacturing techniques used and a design for the desired dimensions of the device, which is typically referred to as a design rule.

A first embodiment of a three-dimensional semiconductor device according to the inventive concept will now be described in further detail with reference to FIGS. 6 through 10.

Figure 6:
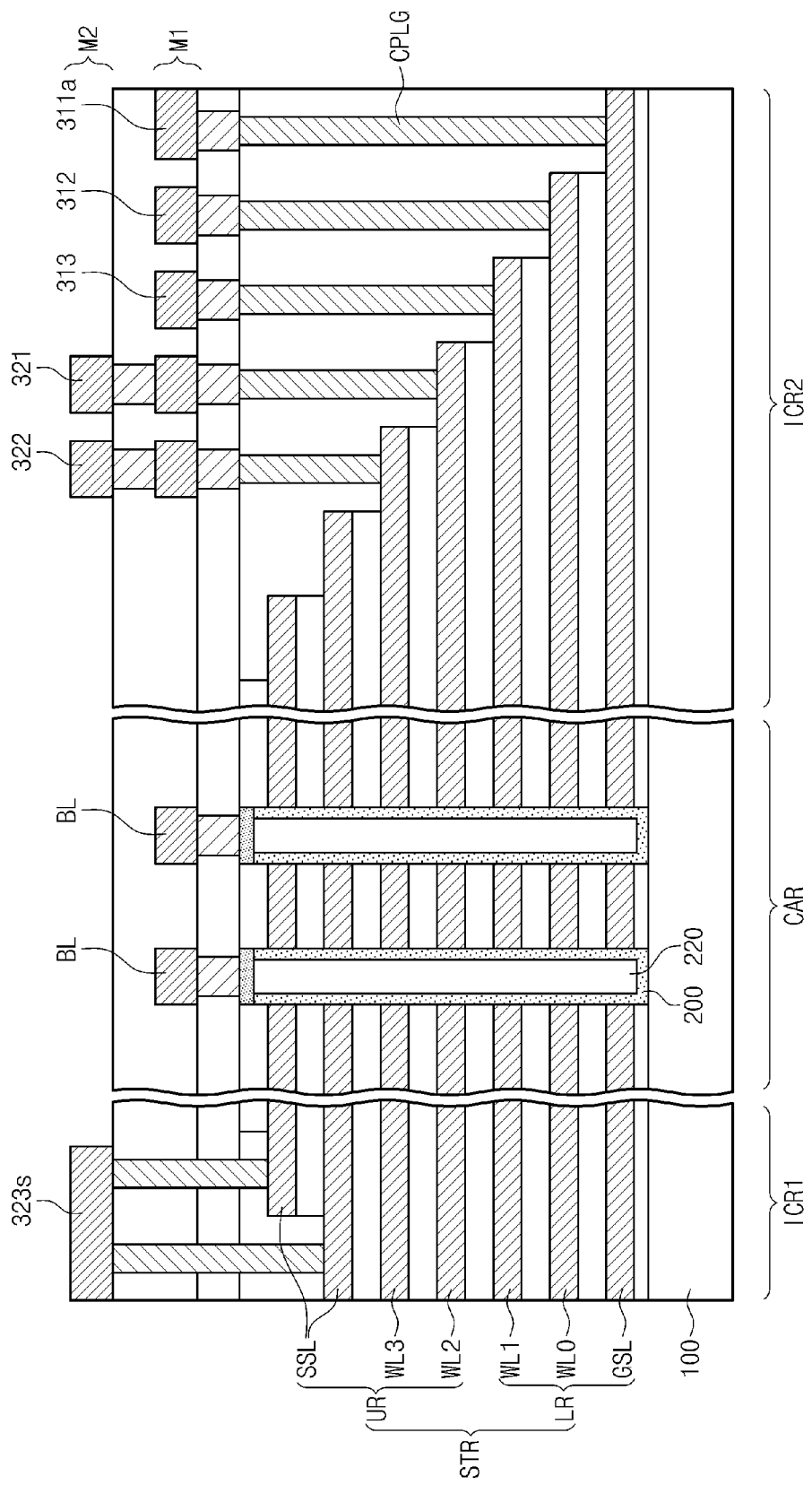
FIG. 6 is a sectional view of part of a first embodiment of a three-dimensional semiconductor device according to the inventive concept.

Referring to FIG. 6, the device has a cell array region CAR, first and second interconnection regions ICR1 and ICR2, and a peripheral circuit region (not shown). The first and second interconnection regions ICR1 and ICR2 are disposed between the cell array region CAR and the peripheral circuit region (not shown), and the cell array region CAR may be disposed between the first and second interconnection regions ICR1 and ICR2.

The substrate 100 may be a substrate of bare semiconductor material (e.g., may be a silicon wafer), insulating material (e.g., glass), semiconductor material covered by an insulating material, or conductive material.

Memory cell transistors MCT of the type described with reference to FIGS. 2 through 5, and bit lines BL and word lines WL0 to WL3 connected to the memory cell transistors MCT are disposed in the cell array region CAR. Circuits constituting the row decoder 20, word line driver 30, page buffer 40, etc., described with reference to FIG. 1, are disposed in the peripheral circuit region. For example, a decoder circuit, a word line drive circuit, a page buffer, a sense amplifier, voltage generator circuits, and input/output circuits to drive the memory cell array are disposed in the peripheral circuit region.

Figure 8:
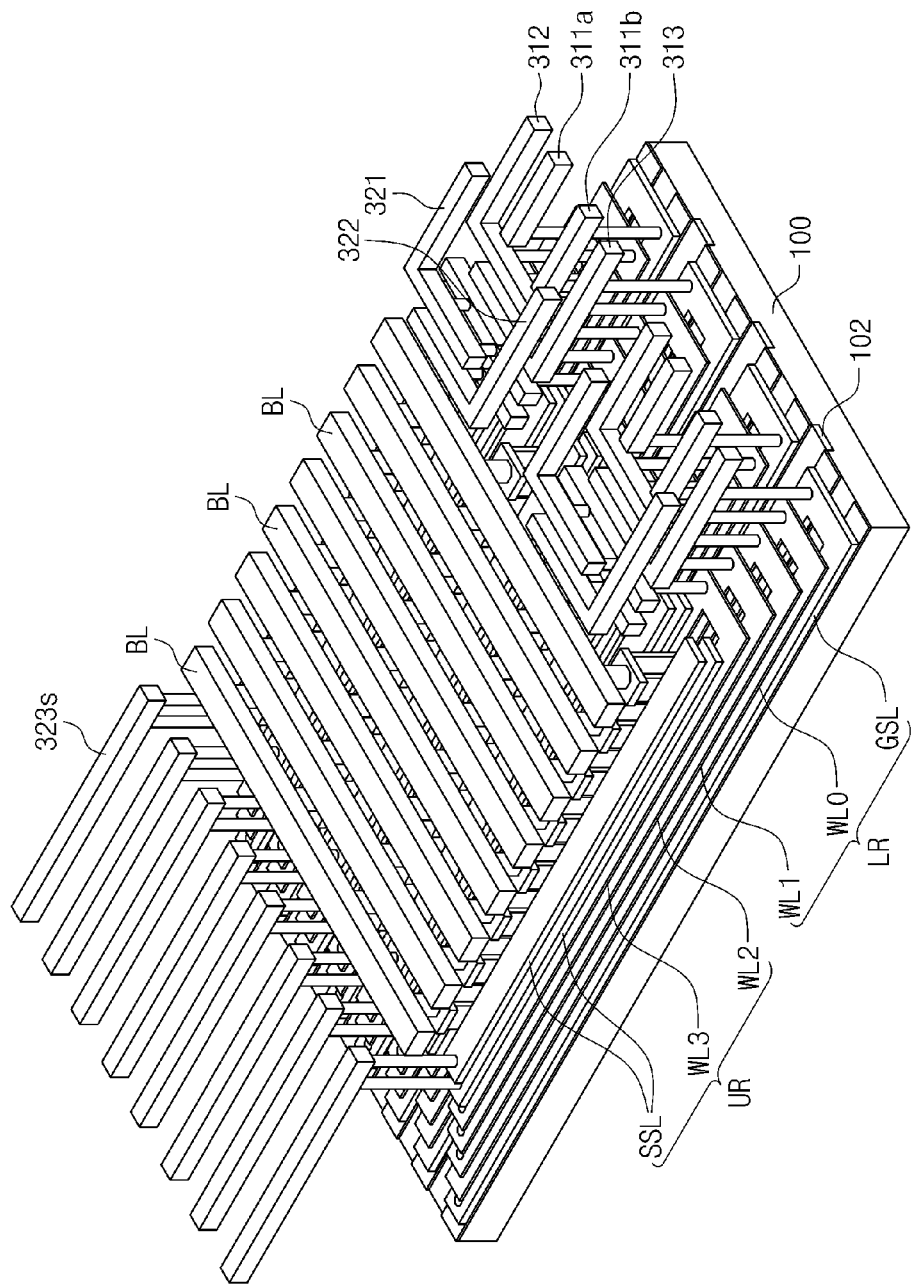
FIG. 8 is a perspective view of conductive elements of the first embodiment of a three-dimensional semiconductor device according to the inventive concept.

In addition, an interconnection structure electrically connecting the word lines WL0 to WL3 with the row decoder 20 is disposed in the first and second interconnection regions ICR1 and ICR2. More specifically, a plurality of stacked structures STR1 to STR8 (FIG. 10) are spaced by predetermined (regular) intervals from each other so as to be arranged two-dimensionally on the substrate 100. Each stacked structure STR (FIG. 8) includes a number L (wherein L is selected from the series $2^2, 2^3, 2^4 \ldots$) of layers of stacked word lines WL. The number L of word lines in each of the stacked structures STR is selected based on the desired capacity of the semiconductor memory device. In this example, the number is 4 (WL0 to WL3). Moreover, each stacked structure STR includes a ground selection line GSL at its lowermost part and a string selection line SSL at its uppermost part. This stacked structure STR extends from the cell array region CAR to each of the first and second interconnection regions ICR1 and ICR2 and may have a stepped shape on each of the first and second interconnection regions ICR1 and ICR2 (FIG. 8).

Vertically stacked word line connection patterns 201 (FIG. 10) are disposed on the second interconnection region ICR2 between the $(2n+1)^{th}$ and $(2n+2)^{th}$ stacked structures STR for each natural number n up to the case in which 2n+2 equals the number of stacked structures STR (n=0, 1, 2, 3 in this example). That is, the word line connection patterns 201 are disposed between stacked structures STR1 and STR2, S3 and STR4, STR5 and STR6 and STR7 and STR8. The word line connection patterns 201 connect horizontally adjacent word lines, respectively.

Furthermore, the distance between the word line connection patterns 201 and the cell array region CAR, in the horizontal direction parallel to the upper surface of the substrate, decreases as the distance between the word lines WL0 to WL3 and the substrate 100 increases. Also, the thickness and material of the word lines WL0 to WL3 and the connection patterns 201 are substantially the same in each layer because the word line connection patterns 201 are formed with, i.e., are unitary with, the word lines WL0 to WL3. Moreover, interconnections connected to the row decoder may be really connected to the respective word line connection patterns 201 through contact plugs CPLUG because the stacked structures STR1 to STR8 are stepped form in the first and second interconnection regions ICR1 and ICR2 (FIG. 8).

Also, according to an embodiment of the inventive concept, with respect to each layer in the stacked structures STR1 to STR8, adjacent ones of the ground selection lines GSL are electrically connected to each other and the ground selection lines GSL in the $(n+1)^{th}$ stacked structures STR are electrically isolated from the ground selection lines GSL in the $(n+3)^{th}$ stacked structure STR for each natural number n up to the case in which n+3 equals the total number of stacked structures STR. More specifically, in the plurality of stacked structures STR1 to STR8, the ground selection lines GSL of the $(2n+1)^{th}$ stacked structures STR1, STR3, STR5, and STR7 are connected by connection patterns 201 with the $(2n+2)^{th}$ stacked structures STR2, STR4, STR6, and STR8, respectively, on the second interconnection region ICR2 like the word lines. Moreover, ground selection interconnections 311a and 311b are respectively connected to the connection patterns 201 that connect the ground selection lines GSL.

Each of the horizontally-adjacent string selection lines SSL are electrically isolated from each other in the stacked structures STR1 to STR8. For this purpose, the string selection lines SSL are connected to a string selection line driver through string selection interconnections 323s connected to the respective string selection lines SSL. Each of the string selection lines, as shown in FIG. 6, may include two layers of conductive material on the top of a stacked structure STR. Additionally, the string selection lines SSL may commonly receive a voltage or may be electrically isolated from each other. In addition, as shown in FIG. 6, each stacked structure STR includes a lower region LR and an upper region UR and the word lines constituting the stacked structure STR may be divided among the lower region and the upper region. Moreover, the upper region UR of the stacked structure includes a string selection line SSL.

More specifically, the lower region LR of the stacked structure STR adjacent to the substrate 100 includes word lines at first to $m^{th}$ (m is a natural number less than L) and the upper region UR of the stacked structure includes the remaining word lines (i.e., word lines having the $(m+1)^{th}$ to $L^{th}$ heights). According to the example shown in FIG. 6, the first and second word lines WL0 and WL1 constitute the lower region LR of the stacked structure STR and the third and fourth word lines WL2 and WL3 constitute the upper region UR. However, other numbers of word lines may constitute the lower and upper regions LR and UR.

Additionally, referring to FIGS. 6 and 8, a first interconnection layer M1 and a second interconnection layer M2 are sequentially stacked on top of the stacked structures STR1 to STR8.

The first interconnection layer M1 includes first interconnections 312 and 313 connected to the word lines WL0 and WL1 included in the lower region LR of the stacked structure STR. Also, the first interconnection layer M1 includes bit lines BL connected to the semiconductor patterns 200 in the cell array region CAR and also includes ground selection interconnections 311a and 311b connected to the ground selection lines GSL in the first interconnection region ICR1. The second interconnection layer M2 includes second interconnections 321 and 322 connected to the word lines WL2 and WL3 in the upper region UR of the stacked structure STR in the second interconnection region ICR2. The second interconnection 321 and 322 may pass over the top of the first interconnections 312 and 313 in the second interconnection region ICR2. Also, the second interconnection layer M2 includes string selection interconnections 323s that are electrically connected to the string selection lines SSL in the first interconnection region ICR1.

The first interconnections 312 and 313 are electrically connected to the respective word lines WL0 to WL1 in the lower region LR of the stacked structure STR and the second interconnections 321 and 322 are electrically connected to the respective word lines WL2 and WL3 in the upper region UR of the stacked structure STR. And, the first and second interconnections 312, 313, 321, and 322 are connected to the row decoder. The ground selection interconnections 311a and 311b may be formed at the same height as the first interconnections 312 and 313 connected to the word lines WL0 and WL1 in the lower region LR of the stacked structure STR. Therefore, the ground selection interconnections 311a and 311b and the first interconnections 312 and 313 may be formed simultaneously during the manufacturing of the semiconductor device.

The bit lines BL are electrically connected to the semiconductor pattern 200 penetrating the stacked structure STR and may be formed at the same height as the first interconnections 312 and 313 connected to the word lines WL0 and WL1. Therefore, the bit lines BL and the first interconnections 312 and 323 may be formed simultaneously during the manufacturing of the semiconductor device. Also, bit line plugs may be formed between the semiconductor patterns 200 and the bit lines BL.

The string selection interconnections 323s may be formed at the same height as the second interconnections 321 and 322 connected to the word lines in the upper region UR of the stacked structure STR. Therefore, the string selection interconnections 323s and the second interconnections 321 and 322 may be formed simultaneously during the manufacturing of the semiconductor device.

Also, the second interconnections 321 and 322 and the string selection interconnections 323s may be disposed at a height from the substrate 100 greater than the height at which the first interconnections 312 and 313 and ground selection interconnections 311a and 311b are disposed.

Figure 9:
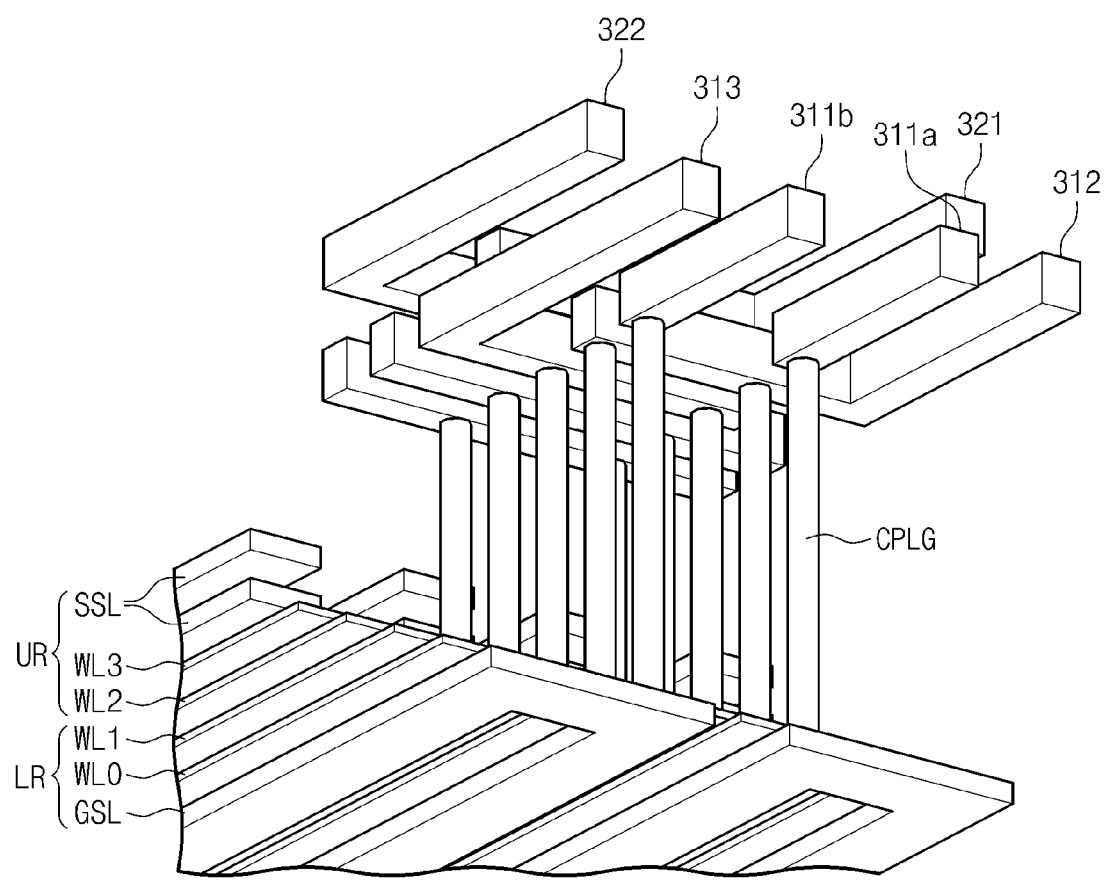
FIG. 9 is a perspective view of part of an interconnection structure shown in FIG. 8.

The first and second interconnections 321 and 322 formed in the first and second interconnection layers M2, the bit lines BL, the ground selection interconnections 311a and 311b, and the string selection interconnections 323s may be formed of a metal such as W, Ti or Ta, a metal nitride such as WN, TiN, or TaN, or a combination of a metal and its nitride. In this embodiment, as shown in FIGS. 8 through 10, each of the first and second interconnections 312, 313, 321, and 322 is commonly connected to two horizontally adjacent word line connection patterns 201. That is, four word lines that are horizontally adjacent are electrically connected and thereby form an aforemention word line group WG. However, each set of four word lines that are connected is electrically isolated from the other sets of four word lines in each layer of the stacked structures STR.

More specifically, as best shown in FIG. 10, each of the first and second interconnections 321 and 322 includes a first extension part connected to the horizontally adjacent connection patterns 201 and a second extension part extending from the first extension part. The first extension part extends over the connected connection patterns 201 perpendicularly to the longitudinal (major) axes of the word lines WL, and the second extension part extends parallel to the longitudinal (major) axes of the word lines WL.

Moreover, the second extension parts of the first interconnections 312 and 313, which connect horizontally adjacent word lines WL in the same stacked structures STR, are horizontally spaced a predetermined distance. Ground selection interconnections 311a and 311b are disposed between the second extension parts of those first interconnections 312 and 313 which connect the word lines WL of a word line group WG. The second extension parts of the second interconnections 321 and 322 are also horizontally spaced a predetermined distance, and the distance between the second extension parts of the second interconnections 321 and 322 may be the same as the distance between the second extension parts of the first interconnections 311 and 313, again for those interconnections 311, 313, 321 and 322 which connect horizontally adjacent word lines WL in the word line group.

Additionally, because the first interconnection layer M1 and the second interconnection layer M2 are formed at respectively different heights from the substrate 100, the first interconnections 312 and 313 and the second interconnections 321 and 322 may vertically overlap each other on the first interconnection region ICR1. In particular, the second extension parts of the second interconnections 321 and 322 may cross over the first or second extension parts of the first interconnections 312 and 313.

Figure 11:
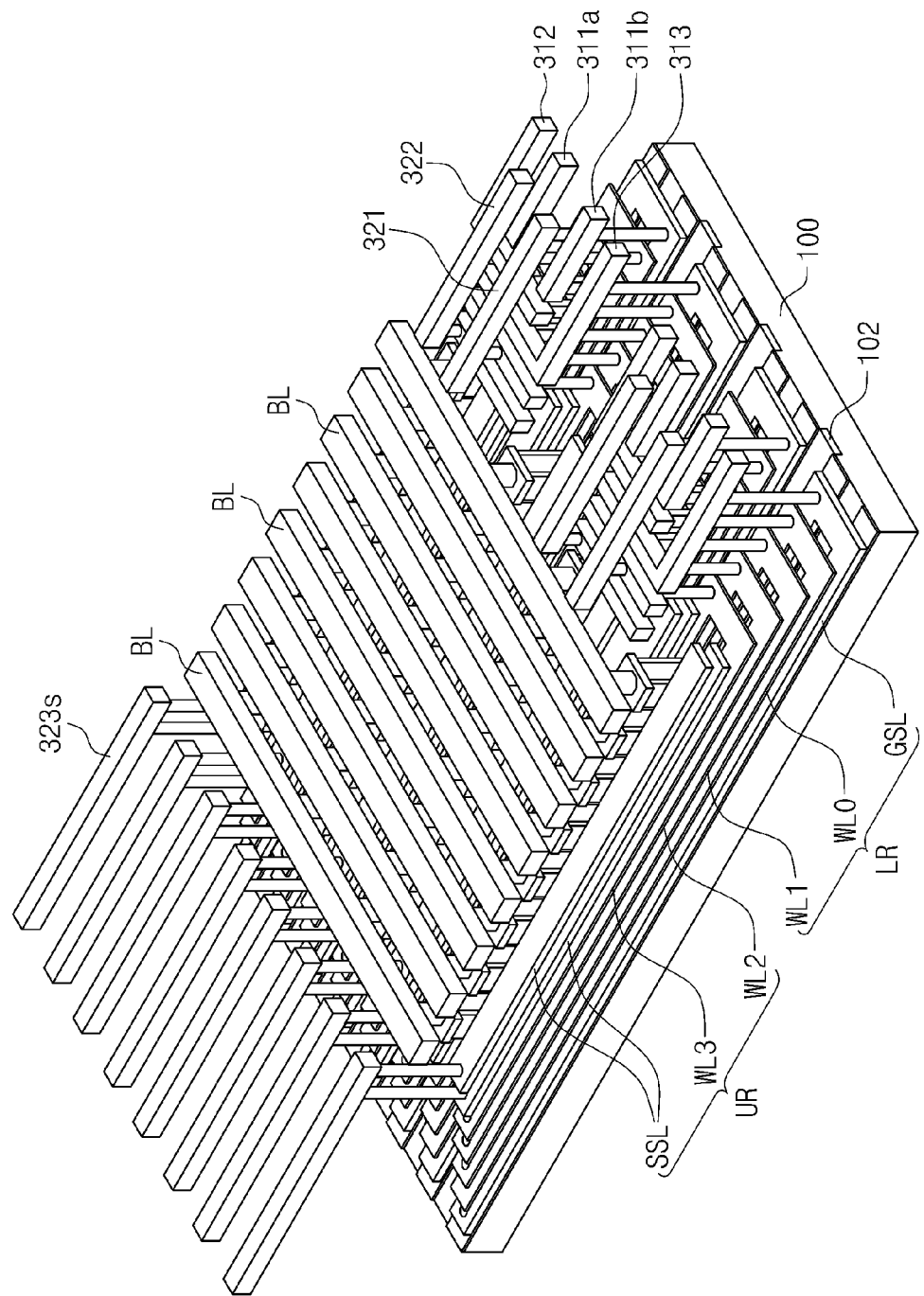
FIG. 11 is a sectional view of another example of conductive elements of the first embodiment of a three-dimensional semiconductor device according to the inventive concept.
Figure 12:
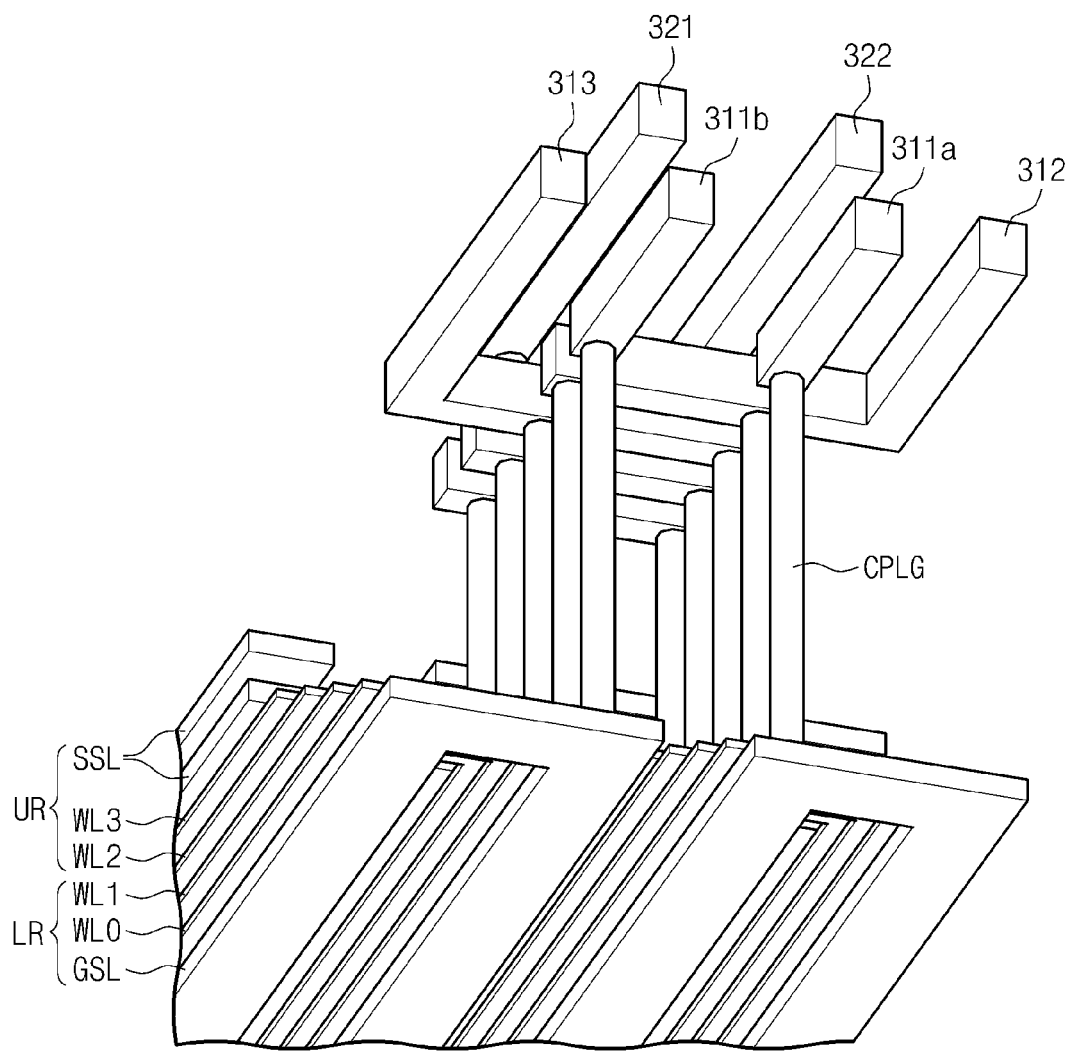
FIG. 12 is a perspective view of part of an interconnection structure shown in FIG. 11.
Figure 13:
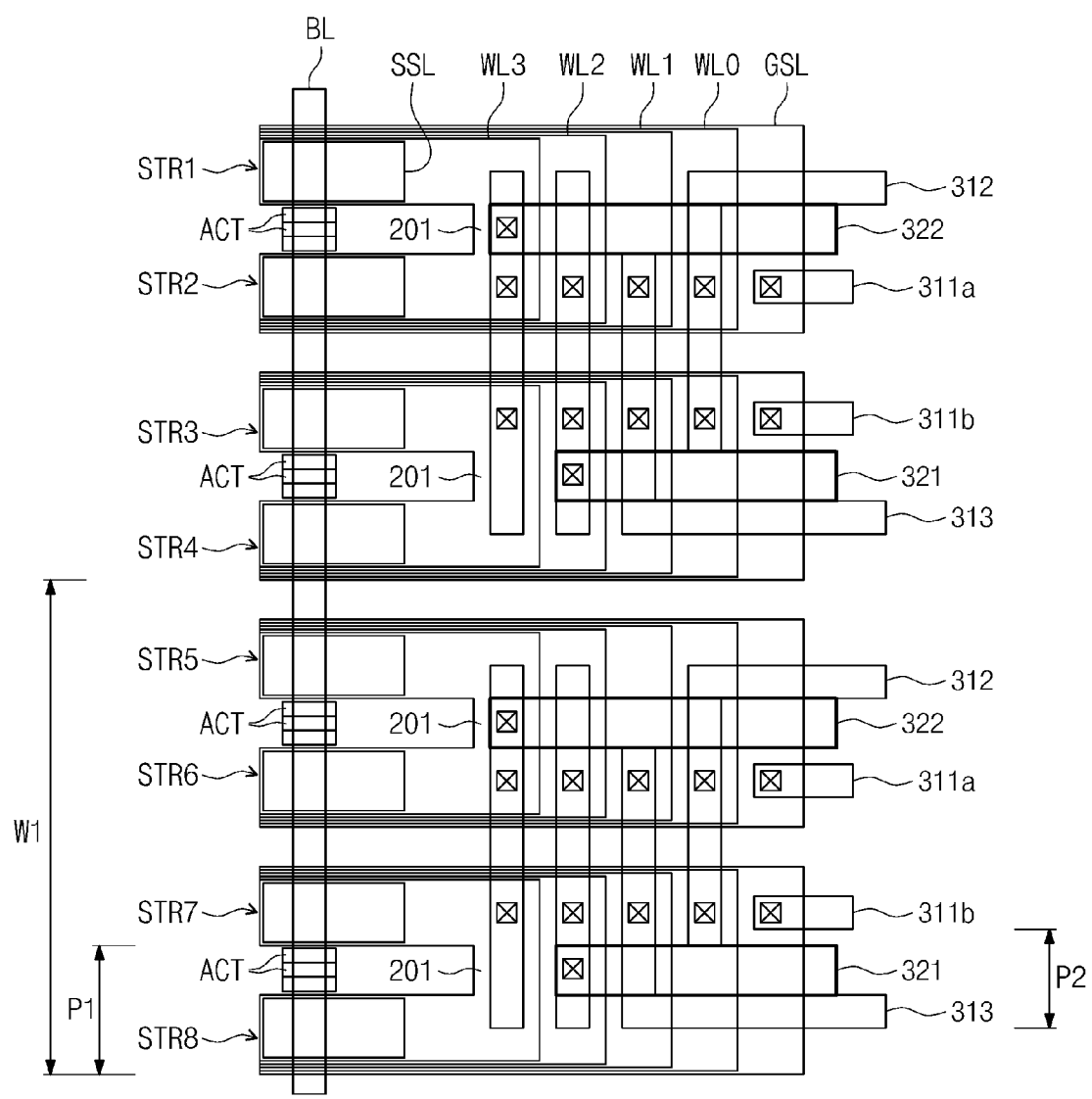
FIG. 13 is a layout diagram of the interconnection structure of the three-dimensional semiconductor device, shown in FIG. 11.

Another version of the first embodiment of a three-dimensional semiconductor device according to the inventive concept will be described with reference to FIGS. 11 to 13.

In this example, each of the first interconnections 312 and 313 includes a first extension part connected to horizontally adjacent connection patterns 201 and a second extension part extending from the first extension part, and each of the second interconnections 321 and 322 have the form of only a line. Conductive pads connecting the connection patterns 201 in the upper region UR of the stacked structures STR are formed in the first interconnection layer M1, as shown in FIG. 13, and the second interconnections 321 and 322 are respectively connected to these conductive pads by conductive plugs CPLUG.

According to the embodiment of the inventive concept described above, the first interconnections and the second interconnections, connecting the stacked word lines WL0 to WL3 to the row decoder, are disposed at different heights from the substrate 100. Therefore, the interconnections may occupy less space compared to a case in which the interconnections were disposed at the same height. Moreover, few word lines need to occupy the same layer, thereby mimimizing the likelihood of cross talk. Accordingly, a reliable and highly integrated three-dimensional semiconductor device can be realized according to the inventive concept.

Another embodiment of the inventive concept will now be described in detail with reference to FIGS. 14 through 21.

Figure 15:
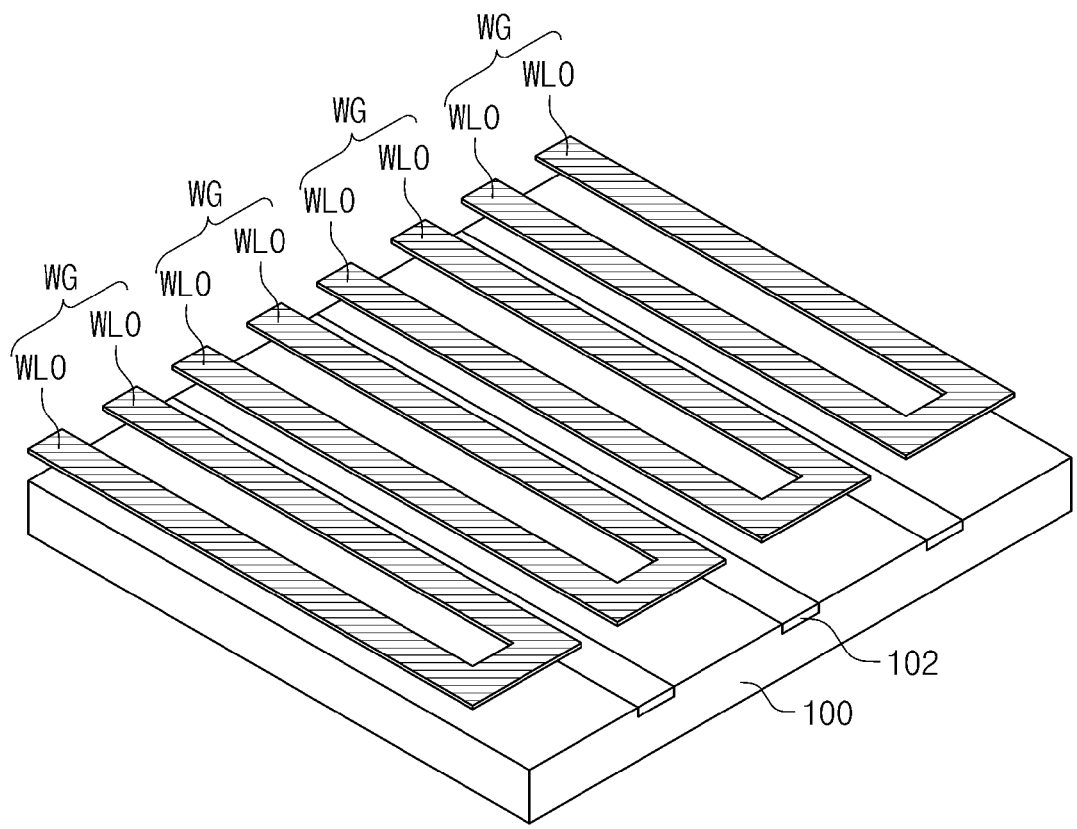
FIG. 15 is a perspective view of a word line group of a three-dimensional semiconductor device according to the inventive concept.
Figure 16:
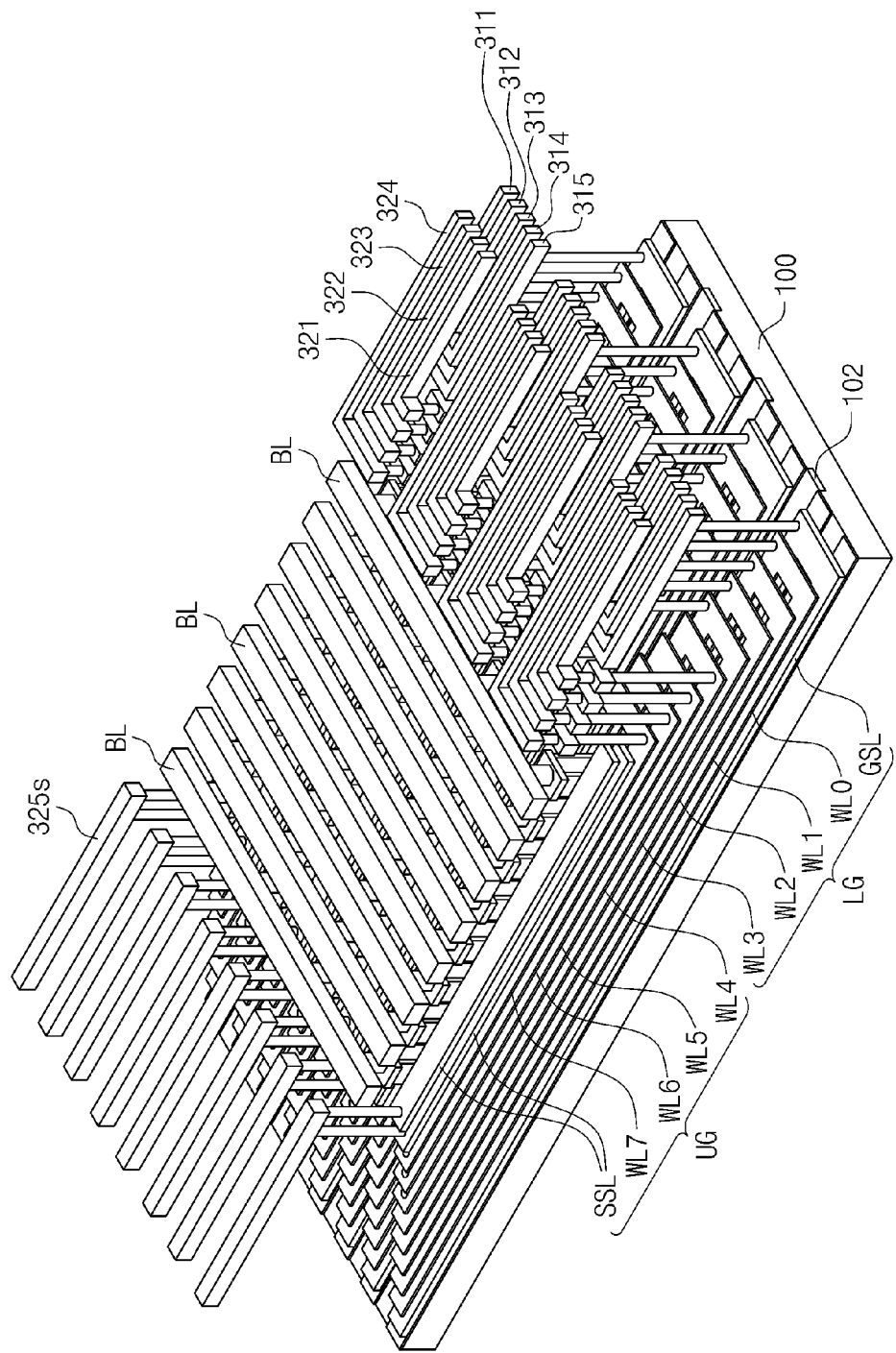
FIG. 16 is a perspective view of conductive elements of a second embodiment of a three-dimensional semiconductor device according to the inventive concept.
Figure 17:
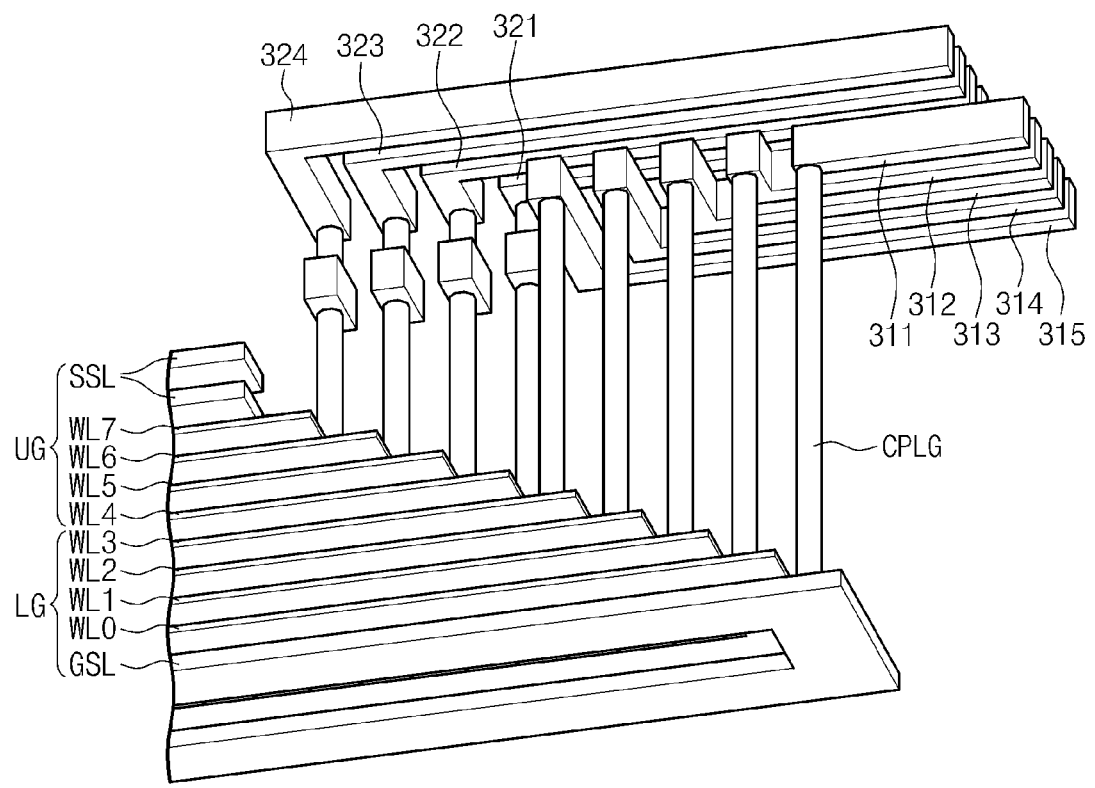
FIG. 17 is a perspective view part of an interconnection structure shown in FIG. 16.
Figure 18:
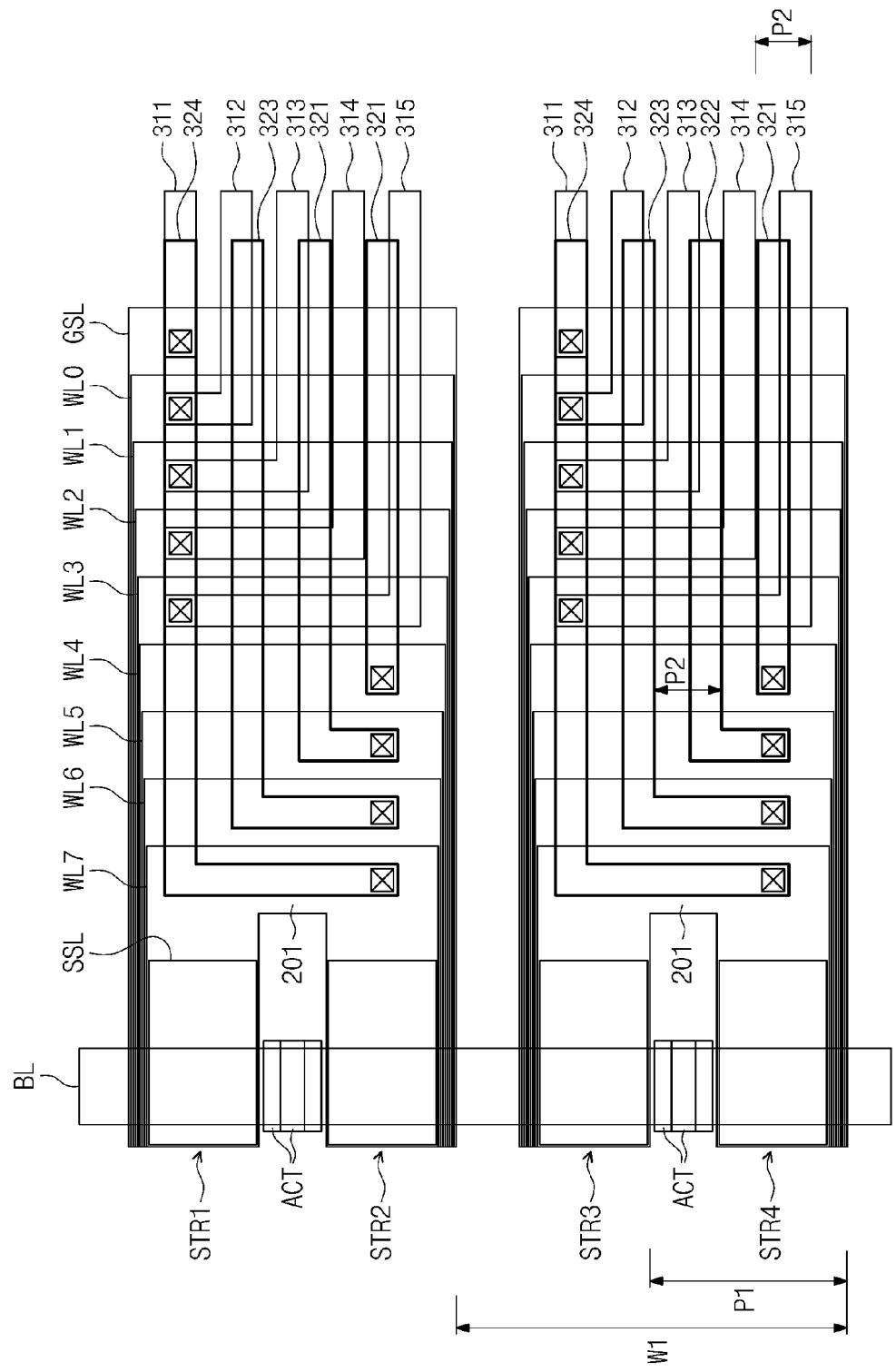
FIG. 18 is a layout diagram of the interconnection structure of the second embodiment of the three-dimensional memory cell array, shown in FIG. 16.

In this embodiment as well, the three-dimensional semiconductor device satisfies: W1<L*P2. Again, W1 is the pitch of word line groups WG (FIG. 15), L is the number of layers of word lines stacked on the substrate 100, and P2 is the minimum pitch of the interconnections on the same layer (FIG. 18). In this embodiment, as shown in FIG. 15, four of the stacked structures STR1 to STR4 are provided, and the word line groups WG each consist of two horizontally-adjacent word lines.

More specifically, referring to FIGS. 14 through 18, each of the stacked structures STR1 to STR4 includes a ground selection line GSL as the lowermost layer thereof, a string selection line SSL as the uppermost layer, and a plurality of word lines WL0 to WL7 between the ground selection string line and the string selection line SSL.

According to this embodiment, with respect to each layer making up the stacked structures STR1 to STR4, adjacent ones of word lines in respective pairs thereof are electrically connected to each other, but the word line in the $(n+1)^{th}$ stacked structure (namely STR1) and the word line in the $(n+3)^{th}$ stacked structure (namely, STR3) are electrically isolated from each other, for each whole number n between 0 and m/2 wherein m is ½ the total number of stacked structures. To this end, word line connection patterns 201 only respectively connect each word line in a $(2n+1)^{th}$ stacked structure (namely, STR1 or STR3) with the word line in the $(2n+2)^{th}$ stacked structure (namely, STR2 or STR4), on the second interconnection region ICR2. Moreover, first and second interconnections 312 to 315 and 321 to 324 are respectively connected to the word line connection patterns 201 so as to connect the word lines WL with the row decoder 20.

Moreover, according to this embodiment, in the bottom layer of the stacked structures STR1 to STR4, adjacent ones of the ground selection lines GSL in respective pairs thereof are electrically connected to each other, but the ground selection line GSL of the $(n+1)^{th}$ stacked structure STR is electrically isolated from the ground selection line GSL of the $(n+3)^{th}$ stacked structure STR, for each whole number n. To this end, word line connection patterns 201 only respectively connect each ground selection line GSL in a $(2n+1)^{th}$ stacked structure (namely, STR1 or STR3) with the ground selection line GSL in the $(2n+2)^{th}$ stacked structure (namely, STR2 or STR4), on the second interconnection region ICR2.

Moreover, each stacked structure STR, as described with respect to the first embodiment, has a lower region LR and an upper region UR, the ground selection lines GSL are disposed in the lower regions, the string selection lines SSL are disposed in the upper regions UR, and the word lines WL0 to WL7 are divided amongst the lower and upper regions LR and UR.

Figure 14:
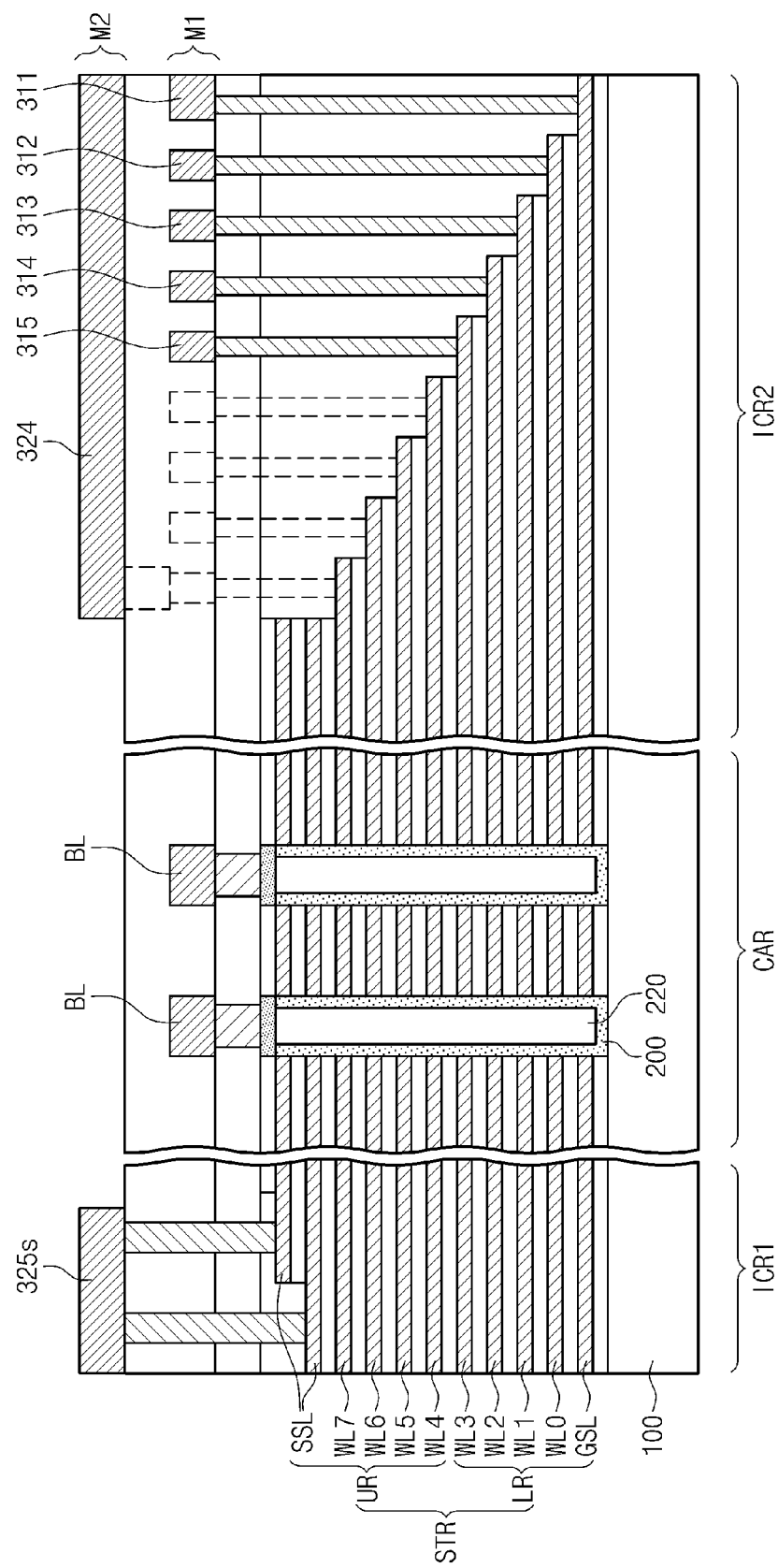
FIG. 14 is a sectional view of another embodiment of a three-dimensional memory semiconductor device according to the inventive concept.

Also, similarly to the first embodiment, first interconnection layer M1 and a second interconnection layer M2 are stacked on the stacked structures STR (FIG. 14). The first interconnection layer M1 includes ground selection interconnections 311 connected to the ground selection lines GSL, and first interconnections 312 to 315 connected to the word lines WL0 to WL3. The second interconnection layer M2 includes string selection interconnections 325s connected to the string selection lines SSL, and second interconnections 321 to 324 connected to the word lines WL4 to WL7. The second interconnections 321 to 324 are stacked on and overlap the first interconnections 312 to 315.

Each of the first and second interconnections 312 to 315 and 322 to 324 includes a first extension part connected to a respective connection pattern 201 and a second extension part extending from the first extension part. The first extension part extends perpendicular to the major axes of the word lines WL0 to WL7 on the connection pattern 201, and the second extension part extends parallel to the major axes of the word lines WL0 to WL7.

Also, as illustrated in FIG. 18, the first extension parts of the first and second interconnections 312 to 315 and 322 to 324 become longer as the distance between the connection patterns 201 and the substrate 100 increases. Moreover, the length of the second extension parts of the first and second interconnections 312 and 315 and 322 to 324 becomes longer as the distance between the connection patterns 201 and the substrate 100 increases.

In addition, the second extension parts of the second interconnections 321 to 324 may cross over the first or second extension parts of the first interconnections 312 to 315 because the second interconnections 321 to 324 are disposed on the first interconnections 312 and 315.

Figure 19:
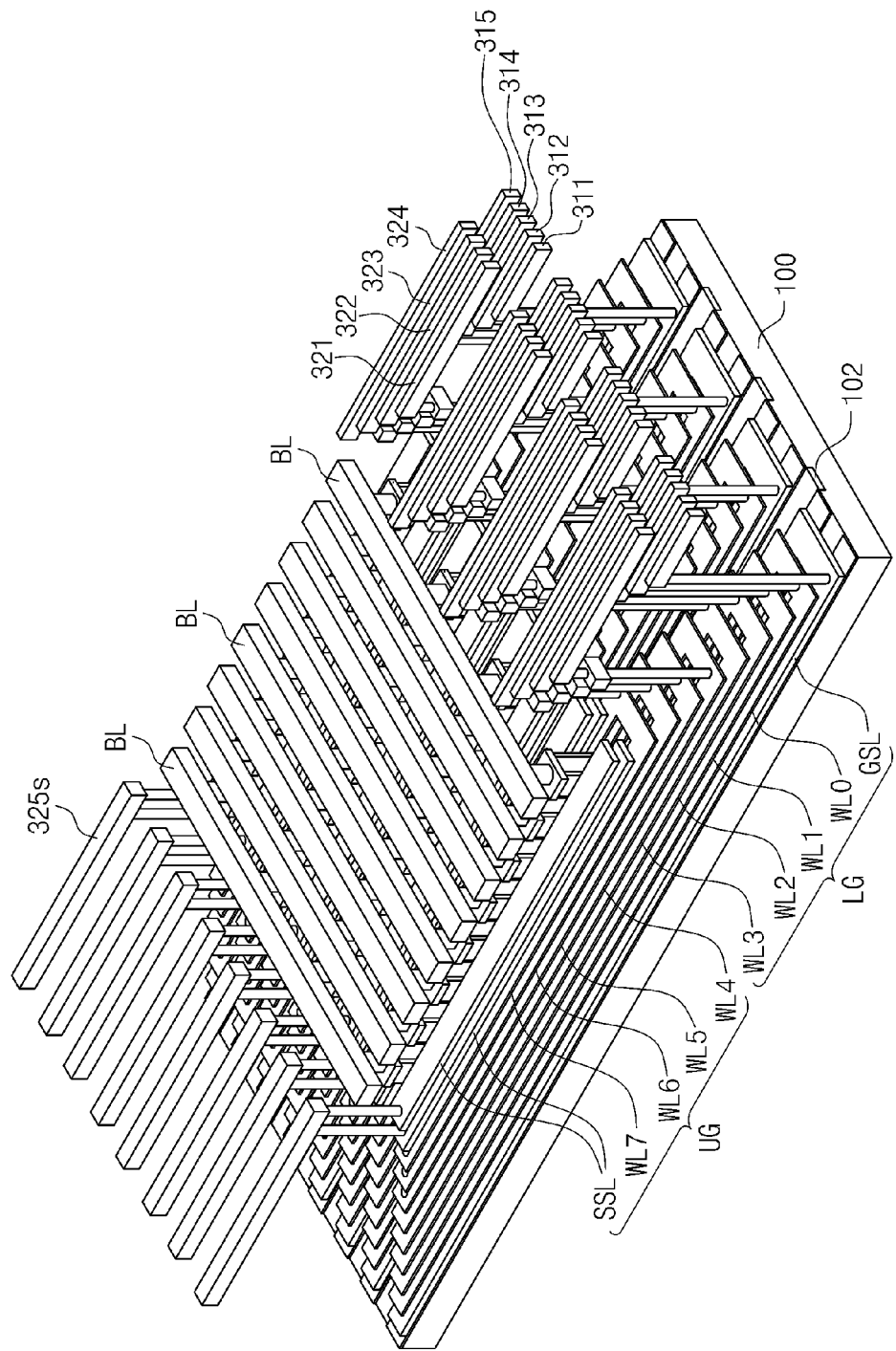
FIG. 19 is a perspective view of another example of the conductive elements of the second embodiment of a three-dimensional semiconductor device according to the inventive concept.
Figure 20:
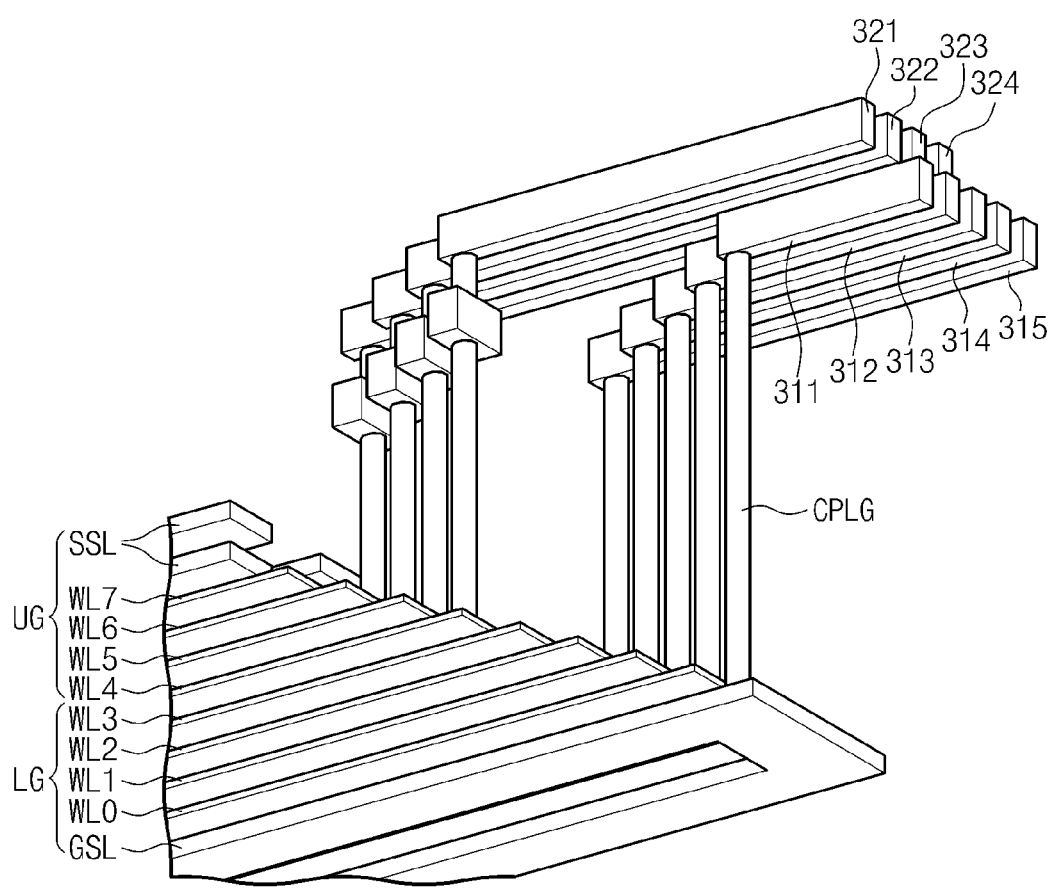
FIG. 20 is a perspective view of part of an interconnection structure shown in FIG. 19.
Figure 21:
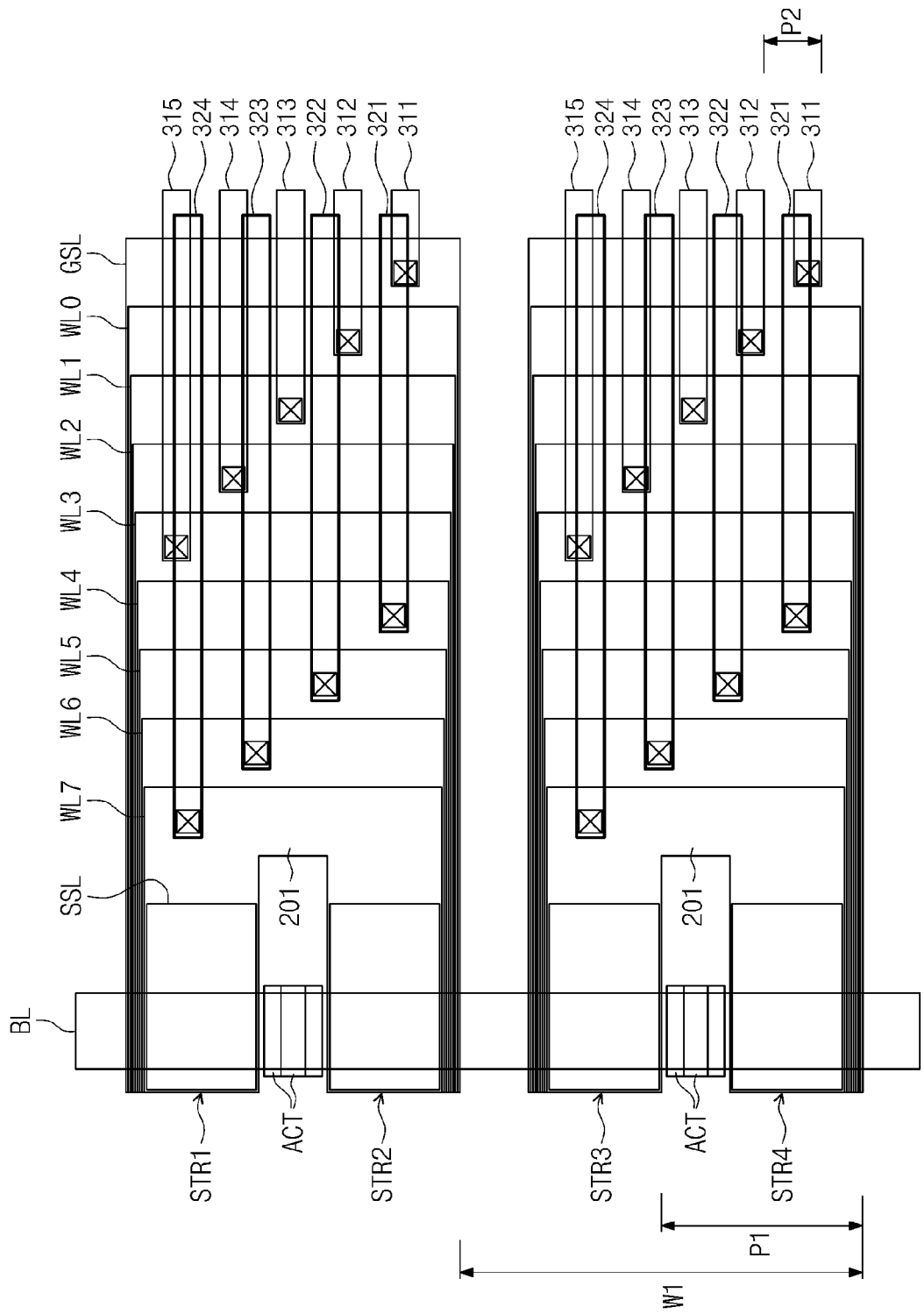
FIG. 21 is a layout diagram of the interconnection structure of the three-dimensional semiconductor device, shown in FIG. 19.

Another example of this embodiment will now be described with reference to FIGS. 19 to 21

In this example, the first and second interconnections 312 to 315 and 321 to 324 each have the form of only a line. Regardless, the second interconnections 321 to 324 of the second interconnection layer M2 can cross over the top surfaces of the first interconnections 312 to 315 of the first interconnection layer M1. Additionally, the number of the first interconnections disposed at the first interconnection layer M1 may be different from the number of second interconnections disposed at the second interconnection layer M2.

Figure 22:
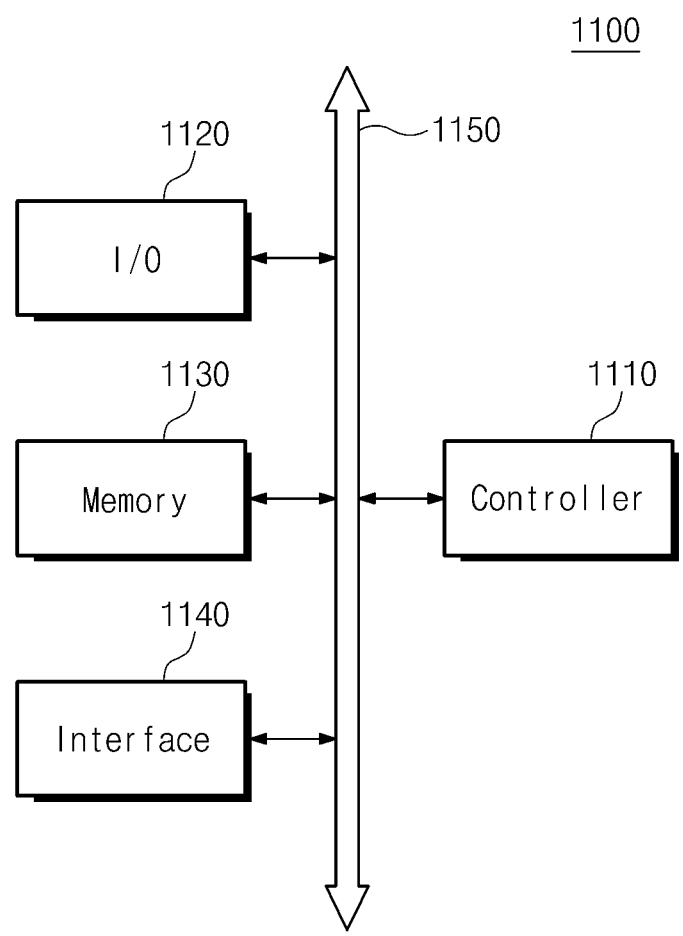
FIG. 22 is a block diagram of a memory system including a three-dimensional semiconductor device according to the inventive concept.

FIG. 22 is a block diagram of a memory system including a three-dimensional semiconductor device according to the inventive concept.

Referring to FIG. 22, the memory system 1100 may be applied to a PDA, a portable computer, a web tablet, a wireless phone, a mobile phone, a digital music player, a memory card, or any wireless device for transmitting and receiving data.

The memory system 1100 includes a controller 1110, an input/output device (or I/O) 1120, a memory 1130, an interface 1140, and a bus 1150. The memory 1130 and the interface 1140 communicate with each other through the bus 1150.

The controller 1110 may include at least one micro processor, digital signal processor, micro controller, or other processors similar thereto.

The memory 1130 may be used for storing commands executed by the controller 1110. The input/output device 1120 receives data or signals from outside the system 1100 and outputs data or signals. For example, the input/output device 1120 may include a keyboard or a keypad, and a display.

The memory 1130 includes a three-dimensional memory cell array according to the inventive concept. The memory 1130 may also include different kinds of memory devices.

The interface 1140 serves to transmit data to a communication network or receives data from the communication network.

Figure 23:
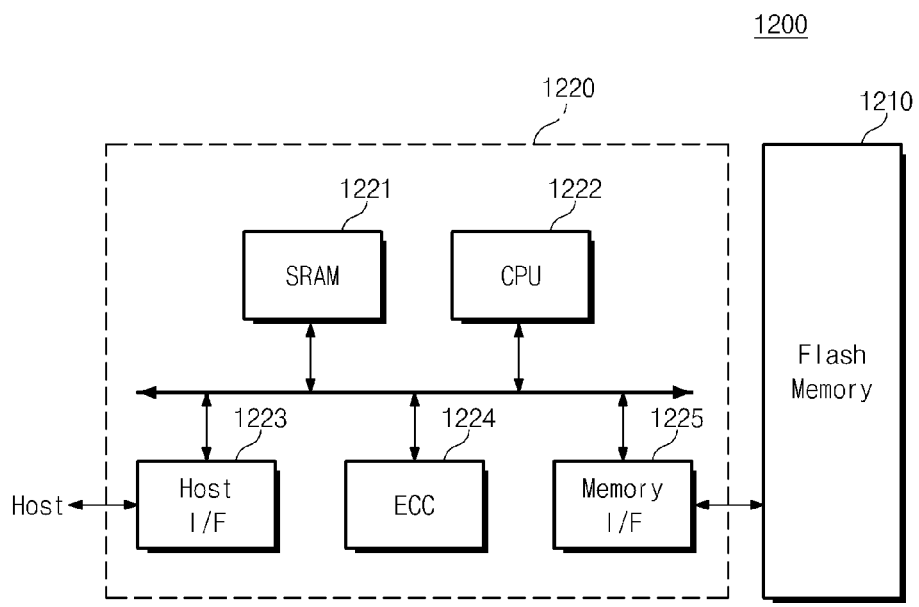
FIG. 23 is a block diagram of a memory card including a three-dimensional semiconductor device according to the inventive concept.

FIG. 23 is a block diagram of a memory card including a three-dimensional semiconductor device according to the inventive concept.

Referring to FIG. 23, the memory card 1200 is configured to provide high-capacity data storage and includes a flash memory device 1210 according to the inventive concept. The memory card 1200 also includes a memory controller 1220 for controlling general data exchanges between a host and the flash memory device 1210.

In the memory controller 1220, an SRAM 1221 serves as an operating memory of a central processing unit (CPU) 1222. A host interface (or I/F) 1223 includes a data exchange protocol of a host connected to the memory card 1200. An error correction code (or ECC) 1224 detects and corrects errors in data read from the multi-bit flash memory device 1210. A memory interface (or I/F) 1225 provides the interface between the flash memory device 1210 and the memory controller 1220.

The CPU 1222 performs general control operations related to data exchange of the memory controller 1220. Although not illustrated in the drawings, it is apparent to those skilled in the art that the memory card 1200 may further include a ROM (not shown) for storing code data to interface with a host.

Figure 24:
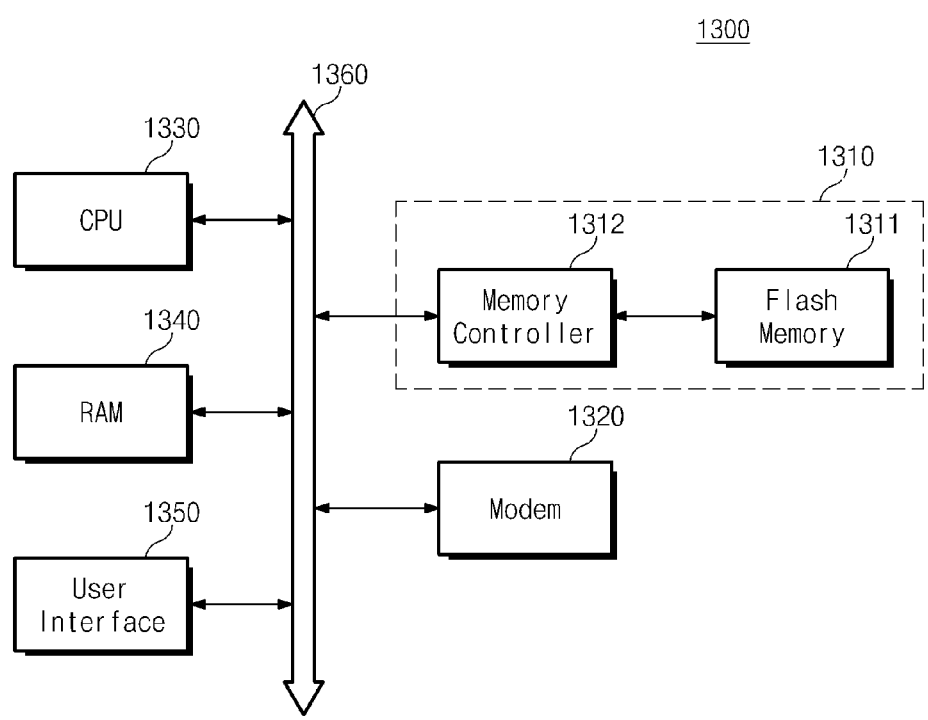
FIG. 24 is a block diagram of a data processing system including a three-dimensional semiconductor device according to the inventive concept.

FIG. 24 is a block diagram of an information processing system including a three-dimensional semiconductor device according to the inventive concept.

Referring to FIG. 24, the information processing system 1300 includes a flash memory system 1310. The flash memory system 1310, includes a flash memory 1311 and a memory controller 1312, and is mounted to a mobile device or a desktop computer. The flash memory system 1310 may thus be configured substantially the same as described with respect to the inventive concept. The mobile device or a desktop computer includes a modem 1320, a CPU 1330, a RAM 1340, and a user interface 1350, which are electrically connected to a system bus 1360.

The flash memory system 1310 stores data processed by the CPU 1330 or data inputted from the external. Here, the flash memory system 1310 may be embodied as a semiconductor disk device (SSD) and in this case, the information processing system 1300 may stably store a large amount of data in the flash memory system 1310. Moreover, the information processing system 1300 may possess a high-speed data exchange characteristic because the highly reliable flash memory system 1310 according to the inventive concept can save resources otherwise consumed for correcting errors. Although not illustrated in the drawings, it is apparent to those skilled in the art that the information processing system 1300 may further include an application chipset, a camera image processor (CIS), and an input/output device.

Additionally, a flash memory device or a memory system comprising a three-dimensional memory semiconductor device according to the inventive concept may be packaged in various ways, i.e., can constitute a semiconductor device in any of many known types of packages. For example, the various kinds of the packages in which a flash memory device or memory system according to the inventive concept may be employed include Package on Packages (PoPs), Ball Grid Arrays (BGAs), Chip Scale Packages (CSPs), Plastic Leaded Chip Carriers (PLCCs), Plastic Dual In-Line Packages (PDIPs), Die in Waffle Packs, Die in Wafer Forms, Chip On Board (COB) packages, Ceramic Dual In-Line Packages (CERDIPs), Plastic Metric Quad Flat Packs (MQFPs), Thin Quad Flat Packs (TQFPs), Small Outline Integrated Circuits (SOICs), Shrink Small Outline Packages (SSOPs), Thin Small Outline Packages (TSOPs), System In Packages (SIPs), Multi Chip Packages (MCPs), Wafer-level Fabricated Packages (WFPs), and Wafer-level Processed Stack Packages (WSPs).

As described above, in a three-dimensional semiconductor device according to the inventive concept, interconnections connected to respective stacked word lines are disposed on respectively different layers such that the area that the interconnections occupy, which is dependent on the number of stacked word lines, is minimized. Moreover, the number of word lines sharing the same layer can be reduced because the area that the interconnections occupy is minimized. Therefore, the degree of integration of the three-dimensional semiconductor memory device can be improved without compromising the reliability of the device.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A three-dimensional semiconductor device comprising:
a substrate;
stacked structures disposed adjacent one another in a horizontal direction on the substrate so as to occupy a two-dimensional space on the substrate;
a first interconnection layer including first interconnections and disposed on the stacked structures;
a second interconnection layer including second interconnections and disposed on the first interconnection layer;
lower and upper conductive connection patterns extending between adjacent ones of respective pairs of the stacked structures, and
wherein each of the stacked structures includes a plurality of stacked word lines so as to have at least one lower word line in a lower region of the stacked structure, and at least one upper word line in an upper region of the stacked structure located on the lower region, and
each of the first interconnections is electrically connected to one of the lower word lines and each of the second interconnections is electrically connected to one of the upper word lines,
each of the lower connection patterns electrically connects lower word lines which are disposed at the same height relative to an upper surface of the substrate, and the lower connection patterns and the lower word lines are of the same material, and have the same thickness, and each lower connection pattern is disposed at the same height relative the upper surface of the substrate as the lower word lines it connects, and
each of the upper connection patterns electrically connects upper word lines which are disposed at the same height relative to an upper surface of the substrate, and the upper connection patterns and the upper word lines are of the same material, and have the same thickness, and each upper connection pattern is disposed at the same height relative the upper surface of the substrate as the upper word lines it connects.

2. The device of claim 1, wherein the first interconnections are each electrically connected to horizontally-adjacent ones of a respective pair of the lower connection patterns, respectively; and
the second interconnections are each electrically connected to horizontally-adjacent ones of a respective pair of the upper connection patterns, respectively.

3. The device of claim 1, having a cell array region and an interconnection region outside the periphery of the cell array region, and
wherein the first and second interconnections and the lower and upper connection patterns are disposed in the interconnection region, and
the distance between one of the lower connection patterns and the cell array region, in a horizontal direction parallel to the upper surface of the substrate, is greater than the distance in the horizontal direction between one of the upper connection patterns and the cell array region.

4. A three-dimensional semiconductor device comprising:
a substrate;
stacked structures disposed adjacent one another in a horizontal direction on the substrate so as to occupy a two-dimensional space on the substrate;
a first interconnection layer including first interconnections and disposed on the stacked structures; and
a second interconnection layer including second interconnections and disposed on the first interconnection layer, and
wherein each of the stacked structures includes a plurality of stacked word lines so as to have at least one lower word line in a lower region of the stacked structure, and at least one upper word line in an upper region of the stacked structure located on the lower region,
each of the first interconnections is electrically connected to one of the lower word lines and each of the second interconnections is electrically connected to one of the upper word lines, and
each of the first and second interconnections comprises a first extension part extending longitudinally in a horizontal direction perpendicularly to longitudinal axes of the word lines and a second extension part extending longitudinally from the first extension part in a horizontal direction parallel to the longitudinal axes of the word lines.

5. The device of claim 4, wherein the first extension part of each one of the interconnections is longer than the first extension part of any other of the interconnections that is located further, than it is, from the cell array region in the horizontal direction parallel to the upper surface of the substrate.

6. The device of claim 4, wherein the first extension parts of the first interconnections run below the second extension parts of the second interconnections.

7. A three-dimensional semiconductor device comprising:
a substrate;

at least four stacked structures disposed adjacent one another in a horizontal direction on the substrate so as to occupy a two-dimensional space on the substrate;

a first interconnection layer including first interconnections and disposed on the stacked structures; and a second interconnection layer including second interconnections and disposed on the first interconnection layer, and wherein each of the at least four stacked structures includes a plurality of stacked word lines so as to have at least one lower word line in a lower region of the stacked structure, and at least one upper word line in an upper region of the stacked structure located on the lower region, and each of the first interconnections is electrically connected to four horizontally adjacent ones of the lower word lines, and each of the second interconnections is electrically connected to four horizontally adjacent ones of the upper word lines.

8. A three-dimensional semiconductor device comprising:

a substrate;

at least two stacked structures disposed adjacent one another in a horizontal direction on the substrate so as to occupy a two-dimensional space on the substrate;

a first interconnection layer including first interconnections and disposed on the stacked structures; and a second interconnection layer including second interconnections and disposed on the first interconnection layer, and wherein each of the stacked structures includes a plurality of stacked word lines so as to have at least one lower word line in a lower region of the stacked structure, and at least one upper word line in an upper region of the stacked structure located on the lower region, and each of the at least two first interconnections is electrically connected to two horizontally adjacent ones of the lower word lines, and each of the second interconnections is electrically connected to two horizontally adjacent ones of the upper word lines.

9. A three-dimensional semiconductor device comprising:

a substrate;

at least one layer of a plurality of interconnections on the substrate; and a number of stacked layers of word lines interposed between the substrate and the interconnections, whereby each layer of word lines is disposed at a respective height from the substrate, and wherein each of the layers of word lines includes a plurality of groups of word lines, each of the groups of word line includes a plurality of word lines in an equipotential state, and each of the interconnections is electrically connected to a respective one of the groups of word lines, and the stacked layers of word lines and the interconnections satisfy W1<L*P2, L being the number of stacked layers of word lines, W1 being the pitch of the word line groups in each layer, and P2 being the minimum pitch of the interconnections in a layer.

10. The device of claim 9, wherein the at least one layer of interconnections consists of two layers of the interconnections stacked one atop the other on the layers of word lines such that the interconnections consist of a first group of interconnections in one layer and a second group of interconnections in another layer.

11. The device of claim 10, wherein the interconnections of the first group thereof are respectively electrically connected to the word line groups disposed at first to $m^{th}$ heights from the substrate, respectively, and the interconnections of the second group thereof are respectively electrically connected to the word line groups disposed at $(m+1)^{th}$ to $L^{th}$ heights from the substrate, m being a natural number less than L.

12. The device of claim 9, wherein each of the groups of word lines includes at least one connection pattern connecting horizontally adjacent ones of the word lines in the group, and the connection patterns and word lines are of the same material and have the same thickness, and each of the connection patterns is disposed at the same height relative the upper surface of the substrate as the horizontally adjacent word lines it connects.

13. The device of claim 9, further comprising:

lower selection lines interposed between the substrate and the layers of word lines; and upper selection lines interposed between the layers of word lines and the interconnections.

14. A three-dimensional semiconductor device having a cell array region and an interconnection region outside the periphery of the cell array region, and comprising:

a substrate;

stacked structures disposed on the substrate adjacent one another in a horizontal direction so as to occupy a two-dimensional space, each of the stacked structures spanning a boundary between the cell array and interconnection regions of the device, and each of the stacked structures including a plurality of stacked word lines so as to have at least one lower word line in a lower region of the stacked structure, and at least one upper word line in an upper region of the stacked structure located on the lower region;

an array of semiconductor patterns in the cell array region of the device and electrically connected to the word lines;

a first interconnection layer confined to one level in the device above that of the stacked structures and including first interconnections disposed in the interconnection region of the device; and a second interconnection layer confined to another level in the device above that of the first level and including second interconnections disposed on the first interconnection layer in the interconnection region of the device, and wherein each of the first interconnections is electrically connected to one of the lower word lines, each of the second interconnections is electrically connected to one of the upper word lines, and the first interconnections are electrically isolated from the second interconnections in the interconnection region of the device, and wherein portions of the first interconnections overlaps portions of the second interconnections in a plan view.

15. The device of claim 14, wherein each of the stacked structures further comprises a string selection line at the uppermost region thereof, and a ground selection line at the lowermost region, the first interconnection layer further comprises ground selection interconnections electrically connected to the ground selection lines, and the second interconnection layer further comprises string selection interconnections electrically connected to the string selection lines.

16. The device of claim 15, wherein the distance between the first interconnection layer and the upper surface of the substrate is greater than the distance between the string selection lines and the substrate.

17. The device of claim 15, further comprising
semiconductor patterns extending from the substrate across sidewalls of the stacked structures; and
a data storage layer interposed between the semiconductor patterns and the stacked structures.

18. The device of claim 17, wherein the first interconnection layer includes bit lines crossing over the word lines and electrically connected to the semiconductor patterns.

* * * * *